United States Patent
Nakabayashi et al.

(10) Patent No.: US 10,129,977 B2
(45) Date of Patent: Nov. 13, 2018

(54) SEMICONDUCTOR DEVICE MOUNTING STRUCTURE, BACKLIGHT DEVICE, AND MOUNTING SUBSTRATE

(71) Applicant: NICHIA CORPORATION, Anan-shi (JP)

(72) Inventors: Takuya Nakabayashi, Tokushima (JP); Akira Hori, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 481 days.

(21) Appl. No.: 14/718,094

(22) Filed: May 21, 2015

(65) Prior Publication Data
US 2015/0342045 A1    Nov. 26, 2015

(30) Foreign Application Priority Data

May 21, 2014  (JP) .................................. 2014-105046
May 13, 2015  (JP) .................................. 2015-098113

(51) Int. Cl.
| | |
|---|---|
| *F21V 7/04* | (2006.01) |
| *H05K 1/11* | (2006.01) |
| *F21V 8/00* | (2006.01) |
| *H05K 1/18* | (2006.01) |
| *H05K 3/34* | (2006.01) |

(52) U.S. Cl.
CPC ............ *H05K 1/111* (2013.01); *G02B 6/0066* (2013.01); *G02B 6/0073* (2013.01); *H05K 1/181* (2013.01);
(Continued)

(58) Field of Classification Search
CPC ...... H05K 1/111; H05K 1/181; G02B 6/0066; G02B 6/0073
(Continued)

(56) References Cited

U.S. PATENT DOCUMENTS

| | | | |
|---|---|---|---|
| 4,851,966 | A | 7/1989 | Roloack et al. |
| 7,804,105 | B2 | 9/2010 | Kim et al. |
| 8,360,593 | B2 | 1/2013 | Kim et al. |
| 2004/0046242 | A1 | 3/2004 | Asakawa |

(Continued)

FOREIGN PATENT DOCUMENTS

| | | |
|---|---|---|
| CN | 1492521 | 4/2004 |
| EP | 0245713 | 11/1987 |
| JP | 10-107326 | 4/1998 |
| JP | 2002-217459 | 8/2002 |

(Continued)

OTHER PUBLICATIONS

Extended European Search Report for corresponding EP Application No. 15168562.5-1803, dated Oct. 26, 2015.

*Primary Examiner* — Anh Mai
*Assistant Examiner* — Meghan Ulanday
(74) *Attorney, Agent, or Firm* — Mori & Ward, LLP

(57) ABSTRACT

A semiconductor device mounting structure includes a semiconductor device and a mounting substrate. The semiconductor device includes a first external connection terminal and a device-side mounting insulating region. The first external connection terminal is provided at a first end and has a metal region on a semiconductor mounting surface of the semiconductor device. The device-side mounting insulating region is defined by the metal region on the semiconductor mounting surface. The semiconductor mounting surface faces a substrate mounting surface. The mounting substrate has on the substrate mounting surface a land pattern made of an electrically conductive material to be electrically connected to the first external connection terminal. The land pattern is provided in a first shape to surround the device-side mounting insulating region and includes a land-side insulating region which has a second shape to correspond to a periphery of the device-side mounting insulating region.

18 Claims, 13 Drawing Sheets

(52) U.S. Cl.
CPC . *H05K 3/3442* (2013.01); *H05K 2201/09381* (2013.01); *H05K 2201/09427* (2013.01); *H05K 2201/09472* (2013.01); *H05K 2201/09745* (2013.01); *H05K 2201/10106* (2013.01); *H05K 2201/10454* (2013.01); *H05K 2203/048* (2013.01); *Y02P 70/611* (2015.11)

(58) Field of Classification Search
USPC .......................................................... 362/611
See application file for complete search history.

(56) References Cited

U.S. PATENT DOCUMENTS

| | | |
|---|---|---|
| 2007/0108257 A1 | 5/2007 | Liao et al. |
| 2009/0179219 A1 | 7/2009 | Kim et al. |
| 2010/0202131 A1 | 8/2010 | Kim et al. |
| 2010/0232179 A1 | 9/2010 | Tsang et al. |
| 2012/0112622 A1 | 5/2012 | Suzuki et al. |
| 2012/0217526 A1 | 8/2012 | Kumura |
| 2013/0335933 A1 | 12/2013 | Ishii et al. |

FOREIGN PATENT DOCUMENTS

| | | |
|---|---|---|
| JP | 2006-32511 | 2/2006 |
| JP | 2007-35881 | 2/2007 |
| JP | 2008-59987 | 3/2008 |
| JP | 2008-140596 | 6/2008 |
| JP | 2011-023484 | 2/2011 |
| JP | 2012-212794 | 11/2012 |
| JP | 2013-243229 | 12/2013 |
| TW | 200921955 | 5/2009 |
| TW | 201032348 | 9/2010 |
| TW | 201135964 | 10/2011 |

SEMICONDUCTOR DEVICE MOUNTING STRUCTURE, BACKLIGHT DEVICE, AND MOUNTING SUBSTRATE

CROSS-REFERENCE TO RELATED APPLICATIONS

The present application claims priority under 35 U.S.C. § 119 to Japanese Patent Application No. 2014-105046, filed May 21, 2014 and Japanese Patent Application No. 2015-098113, filed May 13, 2015. The contents of these applications are incorporated herein by reference in their entirety.

BACKGROUND OF THE INVENTION

1. Field of the Invention

The following disclosure relates to a semiconductor device mounting structure, a backlight device, and a mounting substrate.

2. Description of Related Art

Various light sources have been used in electronic devices. For example, side view type light emitting devices are used as backlight light sources of display panels of electronic devices, etc. Such a light emitting device includes a base body and a light emitting element, the base body including a chip-shaped base material having a recess portion, and a pair of terminals formed on a surface of the base material and connected to the light emitting element. As the base body, there has been proposed one in which a pair of terminals extended from below a light emitting element are circumferentially provided on a surface of a base material in the vicinity of respective both end surfaces.

For mounting such a semiconductor light emitting device on a mounting substrate, land patterns 652 are used, each of the land patterns 652 being formed at a position, where a semiconductor light emitting device 601 is mounted, in a wiring pattern provided beforehand on a mounting substrate 651 as shown in FIG. 19. That is, the leads exposed on the bottom surface side of the semiconductor light emitting device are fixed to the rectangular land patterns 652 by solder 653 as shown in FIG. 20. See JP2007-035881A, JP2006-032511A, JP2008-059987A, and 22008-140596A.

SUMMARY OF THE INVENTION

According to one aspect of the present invention, a semiconductor device mounting structure includes a semiconductor device and a mounting substrate. The semiconductor device has a first end and a second end opposite to the first end in a longitudinal direction of the semiconductor device. The semiconductor device includes a first external connection terminal and a device-side mounting insulating region. The first external connection terminal is provided at the first end and has a metal region on a semiconductor mounting surface of the semiconductor device. The device-side mounting insulating region is defined by the metal region on the semiconductor mounting surface. The mounting substrate has a substrate mounting surface and the semiconductor device is mounted on the mounting substrate. The semiconductor mounting surface faces the substrate mounting surface. The mounting substrate has on the substrate mounting surface a land pattern made of an electrically conductive material to be electrically connected to the first external connection terminal. The land pattern is provided in a first shape to surround the device-side mounting insulating region and includes a land-side insulating region which has a second shape to correspond to a periphery of the device-side mounting insulating region.

According to another aspect of the present invention, a backlight device of edge light includes a semiconductor light emitting device, a light guide plate, and a mounting substrate. The semiconductor light emitting device has a first end, a second end opposite to the first end in a longitudinal direction of the semiconductor light emitting device, and a light emitting surface between the first end and the second end in the longitudinal direction. The semiconductor light emitting device includes a first external connection terminal and a device-side mounting insulating region. The first external connection terminal is provided at the first end and has a metal region on a semiconductor mounting surface of the semiconductor light emitting device. The device-side mounting insulating region is surrounded by the metal region on the semiconductor mounting surface. The light guide plate has an end surface. The light emitting surface of the semiconductor light emitting device faces the end surface to input light into the light guide plate from the end surface. The mounting substrate is disposed adjacent to the end surface. The mounting substrate has a substrate mounting surface. The semiconductor light emitting device is mounted on the mounting substrate. The semiconductor mounting surface faces the substrate mounting surface. The mounting substrate has on the substrate mounting surface a land pattern made of an electrically conductive material to be electrically connected to the first external connection terminal. The land pattern is provided in a first shape to surround the device-side mounting insulating region and includes a land-side insulating region which has a second shape to correspond to a periphery of the device-side mounting insulating region.

According to further aspect of the present invention, a mounting substrate for a semiconductor device includes a substrate mounting surface and a land pattern. The substrate mounting surface is to face a semiconductor mounting surface of the semiconductor device. The semiconductor device has a first end and a second end opposite to the first end in a longitudinal direction of the semiconductor device. The semiconductor device includes a first external connection terminal and a device-side mounting insulating region. The first external connection terminal is provided at the first end. The device-side mounting insulating region is surrounded by the first external connection terminal on the semiconductor mounting surface. The land pattern is provided on the substrate mounting surface and made of an electrically conductive material to be connected to the first external connection terminal of the semiconductor device. The land pattern is provided in a first shape having a size to surround the device-side mounting insulating region of the semiconductor device. The land pattern includes a land-side insulating region that is an insulating region having a second shape to correspond to a periphery of the device-side mounting insulating region of the semiconductor device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
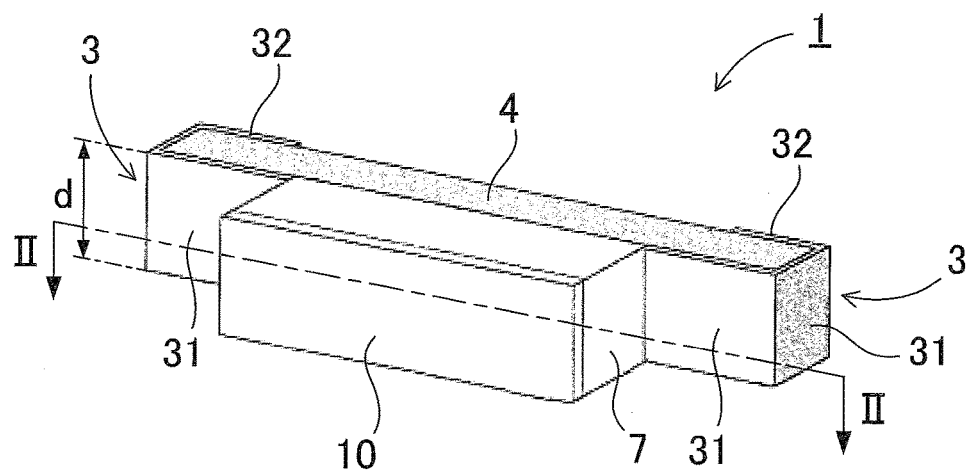
FIG. 1 is a perspective view showing a semiconductor light emitting device of Example 1.

The embodiments will now be described with reference to the accompanying drawings, wherein like reference numerals designate corresponding or identical elements throughout the various drawings. It is to be noted that the embodiments and examples described below are intended to illustrate mounting structures for a light emitting device, backlight devices and mounting substrates for implementing the technical concept of the present disclosure, and the present disclosure is not intended to be limited to the mounting structure for a light emitting device, the backlight device and the mounting substrate to those described below. The sizes, positional relationships and so on of members shown in the drawings may be exaggerated for clarifying the descriptions. Further, in the descriptions below, the same names and symbols denote the same or like members, and detailed descriptions thereof may be appropriately omitted. Further, for elements that constitute the present disclosure, a plurality of elements may be constituted by the same member to use one member for a plurality of elements, or conversely a plurality of members may be involved to realize a function of one member. Matters described in some embodiments and examples may be applicable to other embodiments and examples.

The mounting structure for a semiconductor device according to an embodiment of the present invention can be configured such that a metal region includes a linear region formed of an edge of an external connection terminal, and a device-side mounting insulating region is defined by the linear region.

The linear region can be formed to have a shape that is bent in a substantially rectangular shape or a shape with two substantially parallel linear portions.

Further, the semiconductor device may include an insulating base body extended in one direction.

Further, the external connection terminal may have a rectangular planar metal region exposed on a side surface of the base body which meets the mounting surface.

Further, with the device-side mounting insulating region disposed matching with the land-side insulating region, the land pattern and the external connection terminal can be connected with each other by a bonding member disposed on the metal region so as to rise from the periphery of the linear region onto the planar metal region. With the configuration described above, at the time of mounting, the bonding member rises from the linear region onto the planar metal region on the side surface, so that the semiconductor device can be strongly fixed on the mounting substrate with the bonding member that is continuous from the bottom surface side of the semiconductor device to the side surface thereof.

Further, the metal region may be formed in a shape having three sides that are connected in a U-shape, and the region surrounded by the three sides can serve as a device-side mounting insulating region. With the configuration described above, a self-alignment effect with a land pattern can be exhibited with the metal region, so that strong connection can be achieved while performing positioning.

Further, the land pattern has a substantially rectangular shape as a whole, and a land-side insulating region can be formed in a recessed shape in a plan view at substantially the center of one side of the rectangular shape.

Further, the land-side insulating region may be arranged in each of opposite sides of a pair of the substantially rectangular land patterns which are disposed spaced apart with each other.

Further, the opening width of the land-side insulating region may be smaller than the width of the device-side mounting insulating region.

Further, the opening width of the land-side insulating region may be 0.2 mm or less.

Further, the height of the semiconductor device may be 0.5 mm or less.

Further, the semiconductor device may be a semiconductor light emitting device. In particular, the semiconductor device may be a light source for backlight.

First Embodiment

Figure 2:
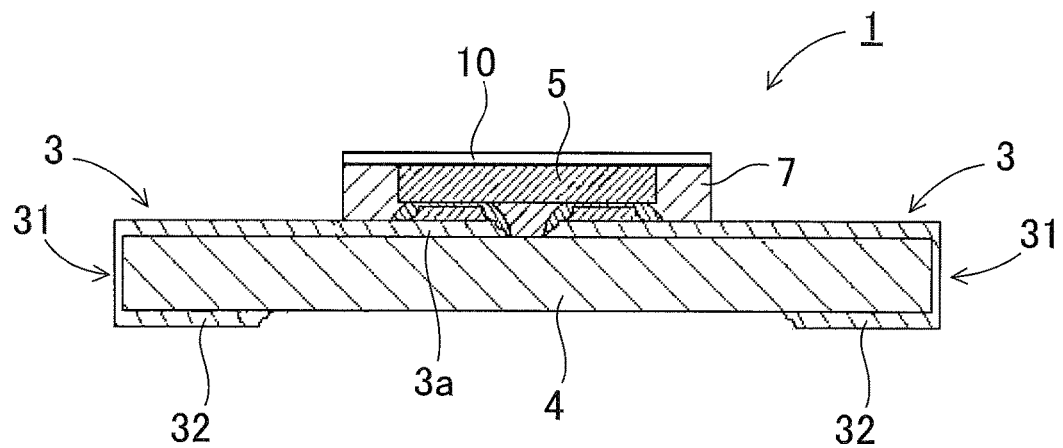
FIG. 2 is a horizontal sectional view taken along the line II-II in the semiconductor light emitting device in FIG. 1.
Figure 3A:
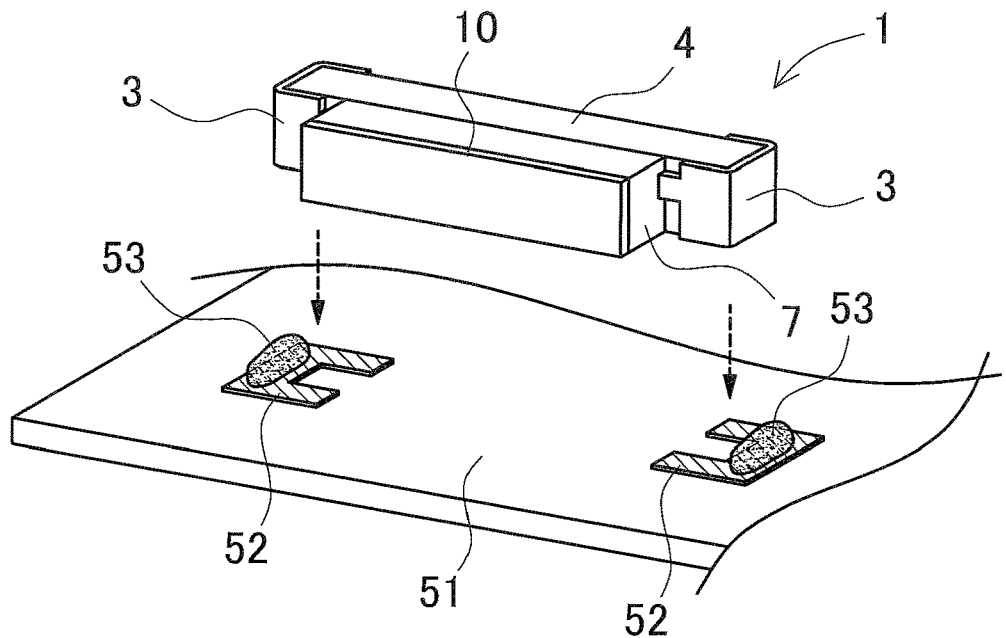
FIG. 3A is an exploded perspective view showing a state in which the semiconductor light emitting device in FIG. 1 is mounted on a mounting substrate.

FIG. 1 shows a perspective view of a semiconductor light emitting device 1 according to a first embodiment of the present invention, and FIG. 2 shows a horizontal sectional view taken along the line II-II of FIG. 1. The semiconductor light emitting device 1 shown in these drawings includes a base body 4 extended in one direction, and a sealing member 7 projected from the base body 4. The sealing member 7 is projected from substantially the center of the base body 4, so that the semiconductor light emitting device 1 has an outer shape with a projection. The base body 4 has an external connection terminal 3 disposed at each of both ends thereof in a longitudinal direction. The external connection terminals 3 are exposed on a surface of the semiconductor light emitting device 1, and serve as electrical connection terminals when the semiconductor light emitting device 1 is mounted, as shown in FIG. 3A, on a mounting substrate 51 described below.

Further, as shown in the sectional view of FIG. 2, a pair of external connection terminals 3 are formed to have a U-shape, i.e. a rectangular shape with one side opened so that each of the external connection terminals 3 covers an end of the base body 4. On the upper surface side of the base body 4, a light emitting element 5 is mounted astride the pair of external connection terminals 3 extended so as to face each other. In the light emitting element 5, a surface opposite to the light emitting surface serves as the mounting surface and positive and negative electrodes are formed on the mounting surface side, and the light emitting element is mounted in a flip-chip manner between the pair of external connection terminals 3 via a bump or by eutectic bonding.

The sealing member 7 is provided so as to cover the periphery of the light emitting element 5 except for the light emitting surface (upper surface) thereof. Further, a light transmissive member 10 is provided on the upper surface of the light emitting surface of the light emitting element 5. The light transmissive member 10 is optically coupled with the light emitting surface of the light emitting element 5. The light transmissive member 10 is to be formed at least on the upper surface of the light emitting surface and may be extended onto the sealing member 7.

(External Connection Terminal 3)

Each of the external connection terminals 3 is exposed at each of both ends of the base body 4 in a longitudinal direction. Such an external connection terminal 3 can be formed by disposing a metal layer on a surface of the base body 4 by plating or the like. The external connection terminal 3 may also be formed by bending a metal plate. An electrical or mechanical metal region on the mounting surface is formed in a shape (linear shape) having two substantially parallel sides. The metal region is not necessarily required to provide an electrical connection, and only mechanical connection may be provided. In this case, the semiconductor light emitting device is electrically connected to the mounting substrate using other electrical connection members.

In the present embodiment, the external connection terminal 3 is formed in a U-shape in plan view, and has a linear region 32 and a planar metal region 31. The planar metal region 31 is exposed in a rectangular shape on a side surface side of the base body 4 which crosses the mounting surface. In the present embodiment, the planar metal region 31 is provided in a U-shape so as to continuously cover the sides surfaces side of the base body 4, that is the three surfaces of a front surface, an end surface, and a back surface shown in FIG. 1, The linear region 32 is the edge of the planar metal region 31, and has a U-shape formed in a rectangular shape on the mounting surface. That is, the width of the linear region 32 has a width which is the thickness of the metal layer that forms the external connection terminal 3.

(Device-Side Mounting Insulating Region 34)

Figure 3B:
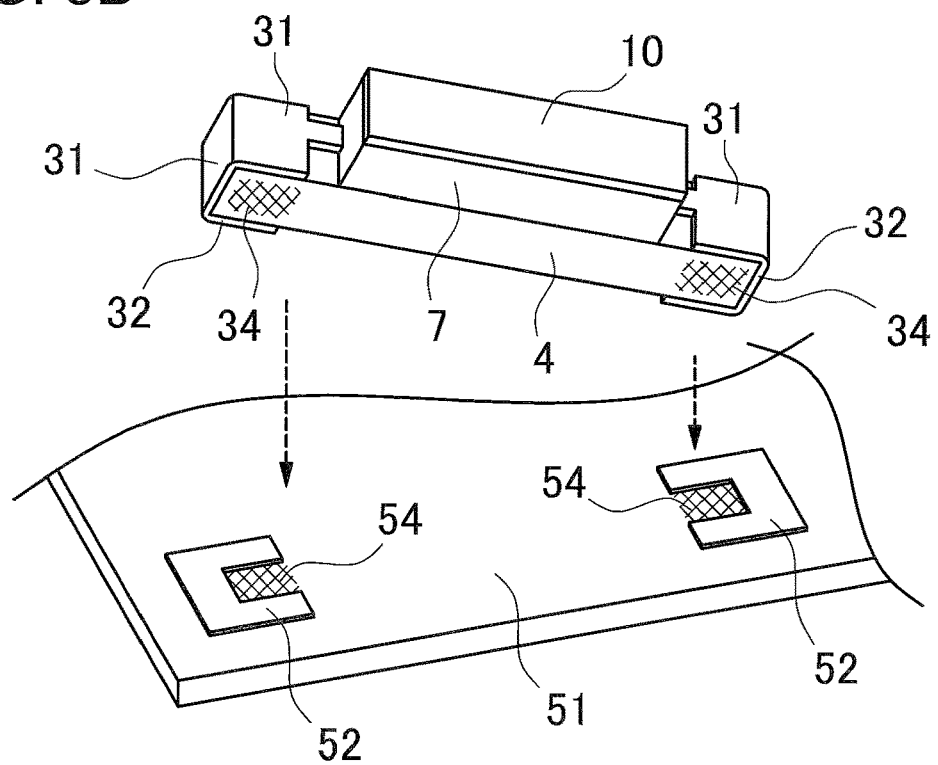
FIG. 3B is an exploded perspective view showing a state of the semiconductor light emitting device in FIG. 3A as seen obliquely from below.

The edge of the base body 4 surrounded by the linear region 32 forms the device-side mounting insulating region 34 as shown in the perspective view of FIG. 3B. For this reason, the base body 4 is made of an insulating member. Accordingly, the linear region 32 is formed so as to surround, or border the device-side mounting insulating region 34. In the present specification, the device-side mounting insulating region 34 does not refer to the whole of the insulating base body 4, but refers only to a region surrounded by the linear region 32.

The semiconductor light emitting device 1 is mounted on land patterns 52 formed on the mounting substrate 51 as shown in FIGS. 3A to 9. A pair of land patterns 52 are formed on the mounting substrate 51 beforehand in correspondence with the distance between the pair of external connection terminals 3 so that the land patterns 52 are connected to the respective external connection terminals 3 provided at each of both ends of the base body 4 of the semiconductor light emitting device 1. Each of the land patterns 52 has a substantially rectangular shape as a whole, and a land-side insulating region 54 is formed as a recess in substantially the center of one side of the rectangular shape. The land-side insulating region 54 is arranged in each of opposite sides of a pair of the substantially rectangular land patterns 52 which are disposed spaced from each other. Each of the land patterns 52 is formed in a shape conforming to the linear region 32 of the semiconductor light emitting device 1. In the present embodiment, the land-side insulating region 54 is formed in a shape conforming to the pattern of the U-shaped linear region 32.

(Mounting Substrate 51)

The mounting substrate 51 is a substrate having a mounting surface for mounting the semiconductor light emitting device 1 thereon, and as the substrate, a glass epoxy substrate, a printed substrate, a ceramic substrate, a flexible printed substrate or the like may be used. The semiconductor light emitting device 1 can be mechanically connected to the mounting substrate 51 by mounting the semiconductor via a bonding member 53 such as a solder, on the land patterns 52 provided on the mounting substrate 51. The land patterns 52 are also connected to respective wiring patterns, and thus, the semiconductor light emitting device 1 is electrically connected to an electronic circuit formed on the mounting substrate 51.

(Land Pattern 52)

The land pattern 52 is a region for providing electrical connection to the external connection terminal 3 of the semiconductor light emitting device 1. In the example in FIG. 3A etc., a pair of land patterns 52 are formed on the mounting substrate 51 at positions to mount the semiconductor light emitting device 1, and are in correspondence with the positions and sizes of a pair of external connection terminals 3, which are disposed at both ends of the semiconductor light emitting device 1 in a longitudinal direction.

Each of the external connection terminals 3 of the semiconductor light emitting device 1 has the device-side mounting insulating region 34 formed inside the rectangular shape of the linear region 32 as described above. Each of the land patterns 52 accordingly has an overall rectangular shape which is slightly larger than the edge of the semiconductor light emitting device 1, with a recess portion corresponding to the rectangular shape of the linear region 32 formed in a part of the rectangular shape. In the present specification, the term "corresponding to" refers to shapes which are approximately the same shape with different size and one of the shapes is in conformity to the other shape as a whole.

Figure 19:
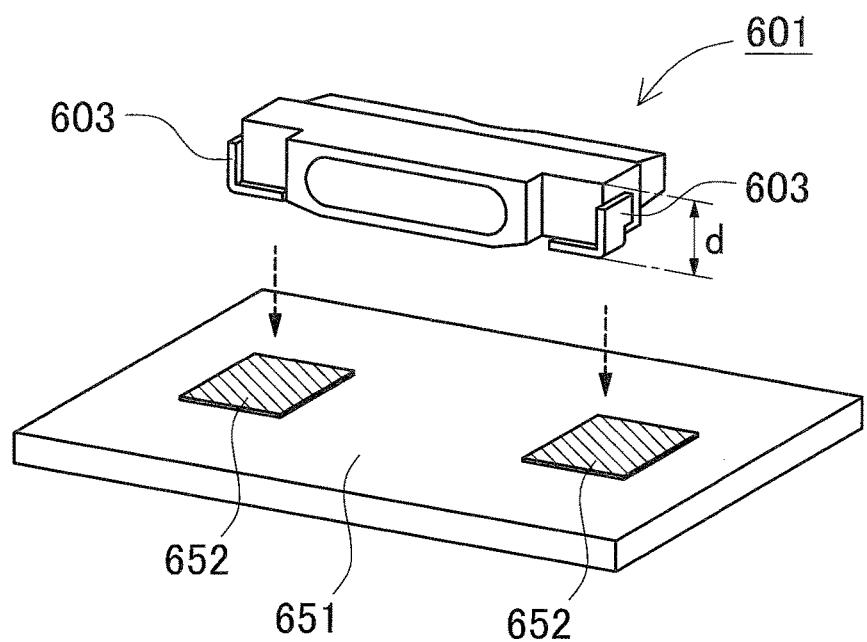
FIG. 19 is an exploded perspective view showing a state in which a semiconductor light emitting device of a related art is mounted on a mounting substrate.
Figure 20:
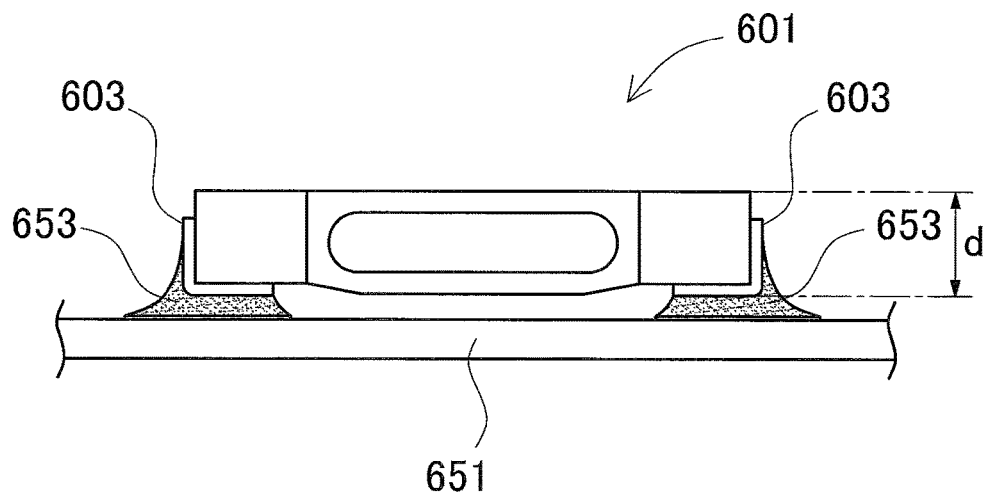
FIG. 20 is a front view showing a state in which the semiconductor light emitting device in FIG. 19 is mounted on a mounting substrate.

Self-alignment effect at the time of mounting can be obtained through a combination of shapes of the device-side mounting insulating region 34 and the linear region 32 surrounding the periphery thereof of the semiconductor light emitting device 1 with shapes corresponding to these regions of the land patterns 52. That is, in conventional techniques, the external connection terminal 603 has a planar shape as shown in FIG. 19 which can provide a large contact area in mounting, so that stable mounting can be achieved while performing positioning. However, in a mode in which the semiconductor device is brought into contact with the land pattern 52 at the end surface of the external connection terminal 3, the contact area in the mounting surface decreases, so that a self-alignment effect may not be sufficiently exhibited, which may cause dislocation from a target mounting position, and thus may result in defective mounting. On the other hand, in this embodiment, the land pattern 52 is formed in a shape to conform to the shape of the device-side mounting insulating region 34 surrounded by the linear region 32 of the semiconductor light emitting device 1. Thus, a positioning effect can be exhibited with the device-side mounting insulating region 34, so that a self-alignment effect can be exhibited at the time of mounting the semiconductor light emitting device 1. In other words, the self-alignment effect in mounting is achieved by forming the profile of the linear region 32, which is an electrically conductive portion, in conformity to the profile of the region formed in a recess in a plan view in the land pattern The land-side insulating region 54 has a shape conforming to the device-side mounting insulating region 34, but is not required to be identical in shape and size to the device-side mounting insulating region 34. For instance, in the examples shown in the plan views of FIGS. 4A and 5, the opening width $T_2$ of the land-side insulating region 54 is slightly smaller than the thickness $T_1$ of the device-side mounting insulating region 34. In those cases, as shown in the enlarged sectional view of FIG. 6, the linear region can be reliably disposed on the land pattern 52 to support the base body 4.

Figure 4A:
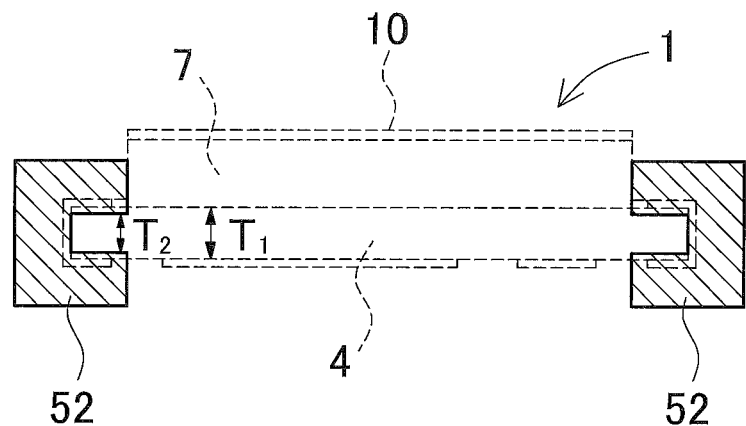
FIG. 4A is a plan view showing land patterns of a mounting substrate.
Figure 4B:
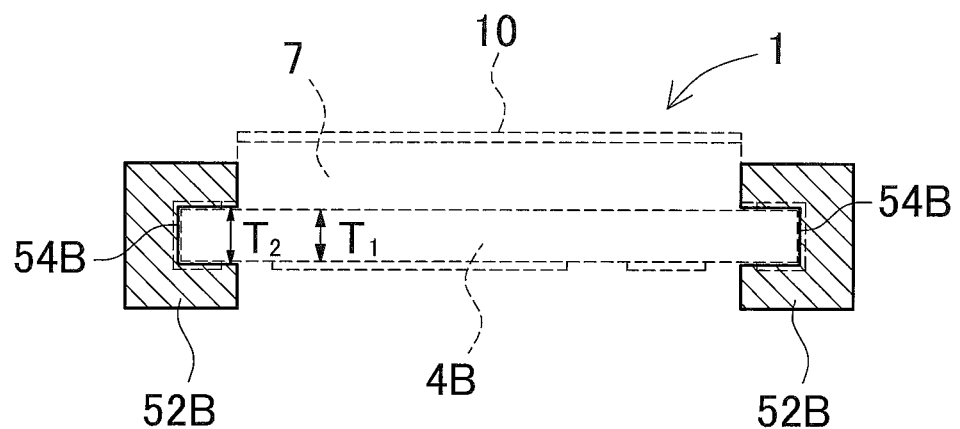
FIG. 4B is a plan view showing land patterns of a mounting substrate in a modification.
Figure 5:
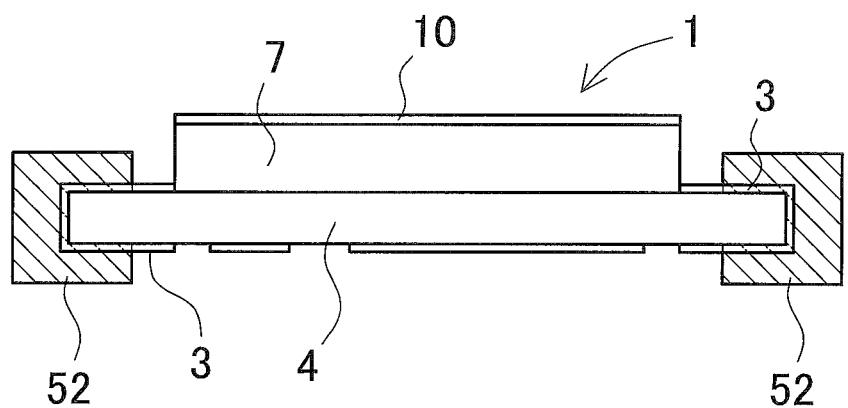
FIG. 5 is a plan view showing a state in which the semiconductor light emitting device in FIG. 1 is mounted on a mounting substrate.

Also, as in a plan view of FIG. 4B showing a semiconductor light emitting device of a modification, the opening width $T_2$ of the land-side insulating region 54B of the land pattern 52 may be slightly larger than the thickness $T_1$ of the device-side mounting insulating region of the base body 4B. By arranging the bonding member 53 so as to apply a solder at least to the device-side linear region as shown in the enlarged sectional view of FIG. 7A, the linear region can be wetted with the solder at the time of melting the solder etc., a fillet FT can be formed from the side surface of the bonding member 53 to the upper surface of the land pattern 52. Further, in this case, a second fillet $FT_2$ that connects the end surface of the land pattern 52 to the lower end of the device-side linear region can be formed. Accordingly, the reliability of solder connection can be further enhanced. A difference between $T_1$ and $T_2$ is preferably 100 μm or less, and may be set to, for example, 75 μm.

Figure 6:
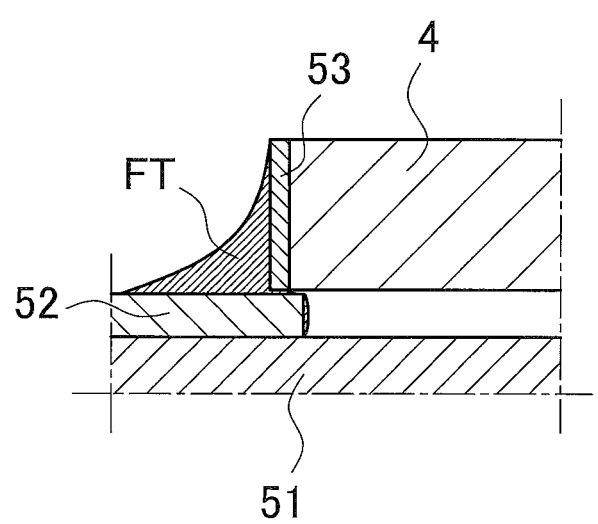
FIG. 6 is an enlarged sectional view of the semiconductor device in FIG. 4A.
Figure 7A:
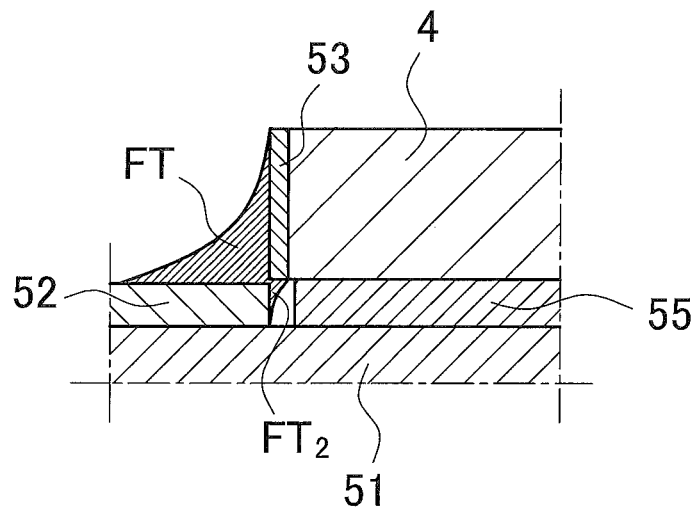
FIG. 7A is an enlarged sectional view of a semiconductor device in a modification.
Figure 7B:
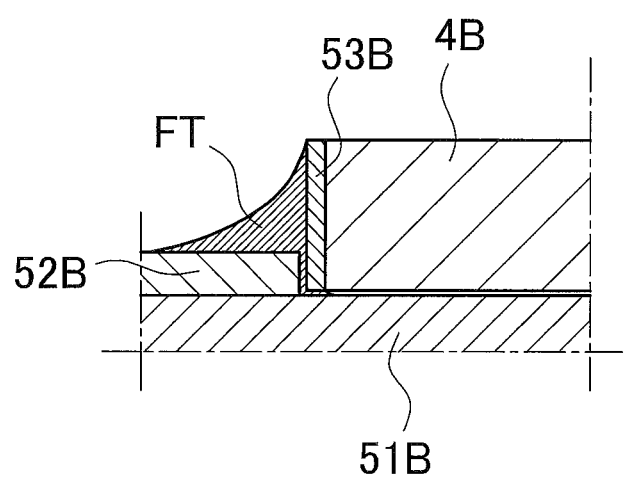
FIG. 7B is an enlarged sectional view of a semiconductor device in another modification.
Figure 8:
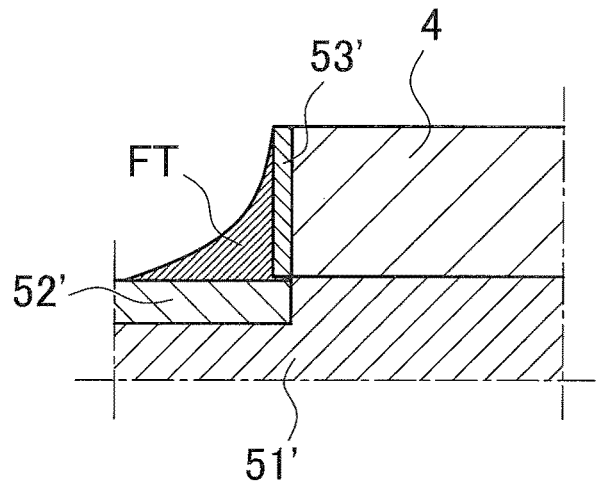
FIG. 8 is an enlarged sectional view of a semiconductor device in another modification.

In either cases shown in FIGS. 6 and 7A, a resist 55 can be disposed between the mounting substrate 51 and the base body 4. It should be noted that as shown in FIG. 7B, a semiconductor light emitting device without a resist can also be used. For example, as in a semiconductor light emitting device of a modification shown in a plan view of FIG. 4B, with a configuration in which the thickness T1 of the device-side mounting insulating region of the base body 4B is slightly smaller than the opening width T2 of the land-side insulating region 54B, even in the case where a slight gap is included between the opening of the land-side insulating region and the device-side mounting insulating region, at the time of mounting on the mounting substrate 51B as shown in a cross section in FIG. 7B, the melted solder forms a filet FT from the side surface of the bonding member 53B onto the upper surface of the land pattern 52, and also the melted solder enters in the lower surface of the linear region and onto a side surface of the land pattern 52B. Thus, the gap can be filled with the solder and the electrical connection can be maintained and also self-alignment effect can be exhibited. Further, in the above example, the land pattern is provided on the flat surface of the mounting substrate 51 but is not limited to this configuration. For example, as shown in the enlarged sectional view of FIG. 8, a recess portion may be formed in a mounting substrate 51', a land pattern 52' is disposed on the recess portion, and the land pattern 52' and a bonding member 53' are bonded to each other via the fillet FT.

Figure 9:
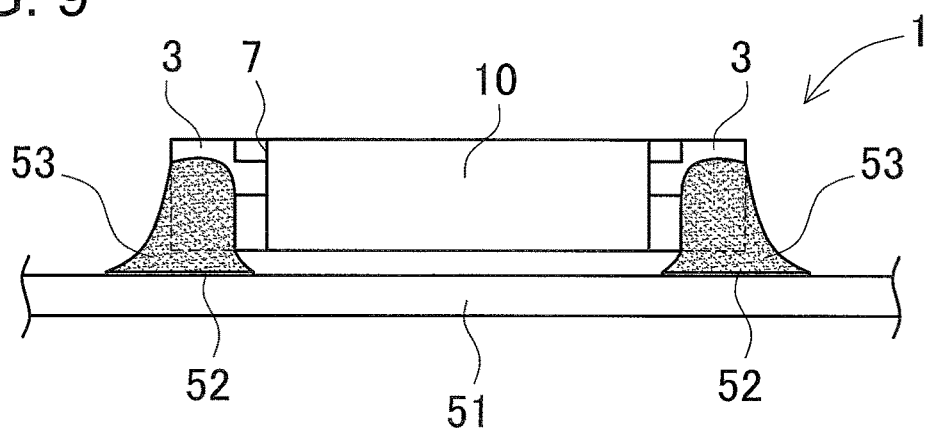
FIG. 9 is a front view showing a state in which the semiconductor light emitting device in FIG. 1 is mounted on a mounting substrate.

The bonding member 53 is extended to rise up onto the side surface of the base body 4 of the semiconductor light emitting device 1 at the time of mounting, and thus further stronger fixation and electrical connection can be obtained. Thus, the external connection terminals 3 have the planar metal region 31 in a rectangular shape on the respective side surfaces of the base body 4 which meet the mounting surface as described above. Accordingly, the linear region 32 formed with the end surface of the planar metal region 31 and the land pattern 52 that surround the land-side insulating region 54 are fixed by the bonding member 52, for example, by using soldering. Also, the bonding member 53 is spread from the linear region onto the planar metal region 31. Thus, as shown in FIG. 9, the external connection terminal 3 and the land pattern 52 can be connected via a wide area of the bonding member 53.

The opening width of the land-side insulating region 54 can be appropriately set, and may be set to, for example, 0.2 mm or less in applications of small and thin backlight devices. However, if the opening width is excessively small, it is difficult to form the land-side insulating region 54, and the land-side insulating region 54 is easily covered with the bonding member 53 at the time of mounting, so that the positioning effect is impaired. Therefore, it is preferred to secure an opening width of 0.1 mm or more.

Figure 10:
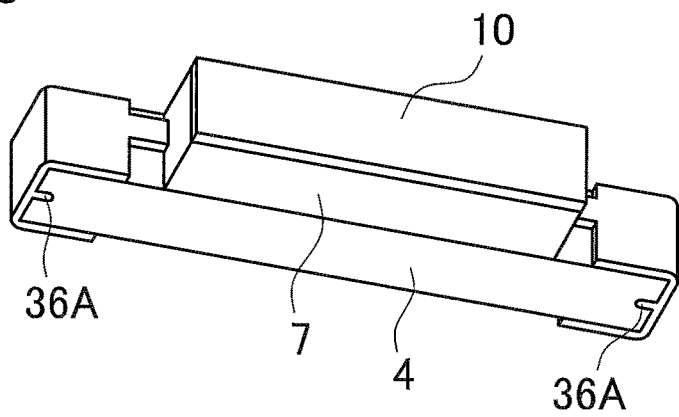
FIG. 10 is a perspective view of the semiconductor light emitting device in a modification as seen obliquely from below.

In the specification, the term "linear region 32" is defined corresponding to the planar metal region 31 and the linear region 32 is to be practically linear. Thus, the term "linear region 32" is applied also to a mode in which partially planar region is included. For example, in the semiconductor light emitting device 1 in a modification shown in FIG. 10, in the perspective view as seen obliquely from below, the linear region 32 is formed to surround three sides of the edge of the base body 4 and further to have a projecting piece 36A which is projected from the side on the edge side of the base body 4. The projecting piece 36A may have a width that is equal to, i.e. the thickness of the metal layer that forms the external connection terminal 3, or larger than the width of the other part of the linear region 32, That is, the projecting piece 36A can be formed with an increased thickness to have a certain amount of area.

With such a projecting piece 36A, the area of the linear region 32 is increased to increase the connection area with the bonding member 53 and the connection part is made to have a more complicated shape, so that an increase in the strength can be achieved. In addition to that, the linear region 32 is made to have a shape more complicated than the U-shaped pattern. Thus, the self-alignment effect at the time of mounting of the light emitting device can be enhanced to further improve the accuracy in positioning.

The land-side insulating region 54 can be made to serve as a route for releasing a gas generated during melting of solder, and resultantly solder voids can be reduced.

Figure 11:
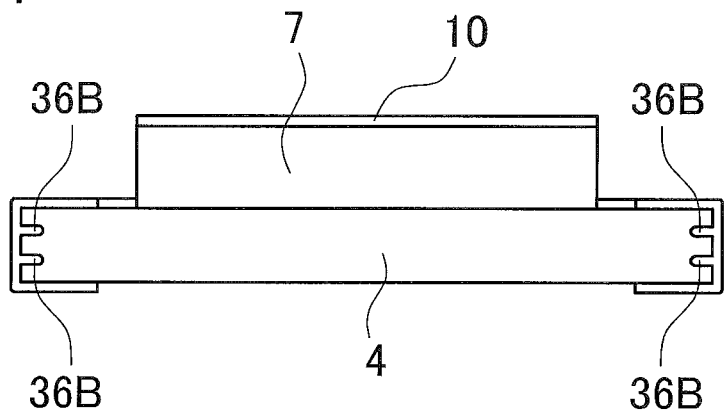
FIG. 11 is a bottom view of a semiconductor light emitting device in another modification.
Figure 12:
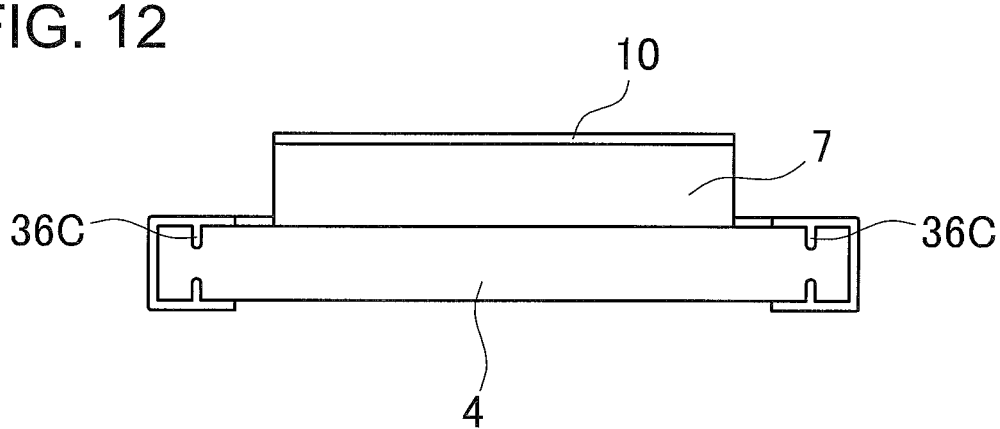
FIG. 12 is a bottom view of a semiconductor light emitting device in still another modification.
Figure 13:
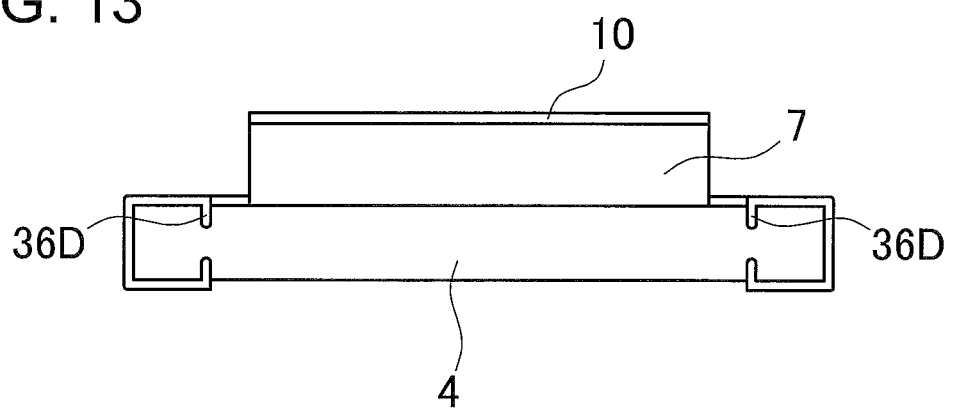
FIG. 13 is a bottom view of a semiconductor light emitting device in still another modification.

Further, without being limited by this example, a plurality of projecting pieces may be provided. For example, as shown in the bottom view of FIG. 11, two projecting pieces 36B may be provided on a side of the edge side of the base body 4. Accordingly, a pattern corresponding to the projecting pieces may also be provided on the land-side metal region. With the arrangement as described above, the linear region 32 can be further increased and the pattern of the linear region 32 can be made complicated, and thus, the self-alignment effect can be further reliably exhibited. The position at which the projecting piece is provided is not limited to the edge side, and for example, like a projecting piece 36C shown in the bottom view of FIG. 12, the projecting piece may be provided on the front side or the back side. In such an aspect, a similar effect is obtained. Further, as shown in FIG. 13, a projecting piece 36D may be provided (in a C-shape) on the opening side of the U-shape so as to narrow the opening end. By providing the projecting piece 36D, the device-side mounting insulating region 34 is further clearly defined, so that it can be expected to improve accuracy of the registration effect.

Second Embodiment

Figure 14A:
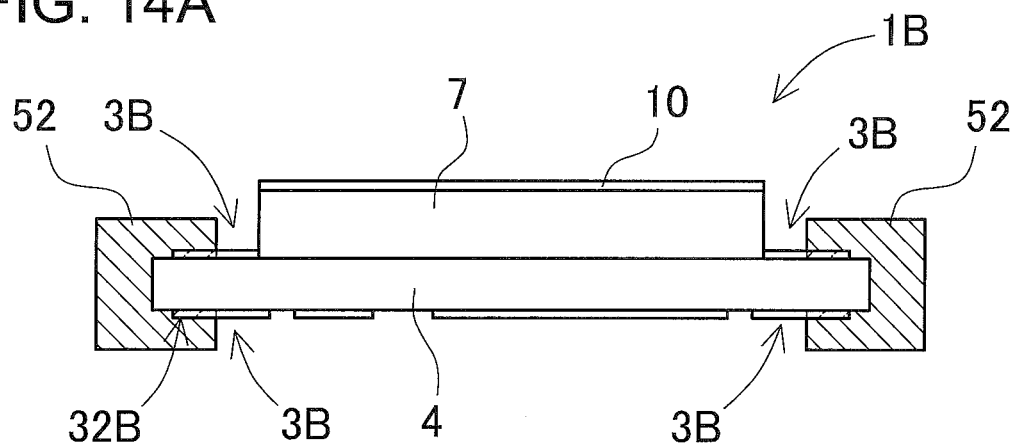
FIG. 14A is a plan view showing a state in which a semiconductor light emitting device of Example 2 is mounted on a mounting substrate.
Figure 14B:
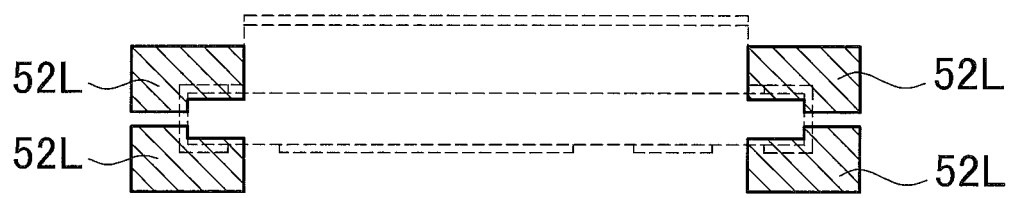
FIG. 14B is a plan view showing land patterns of a mounting substrate in a modification.
Figure 14C:
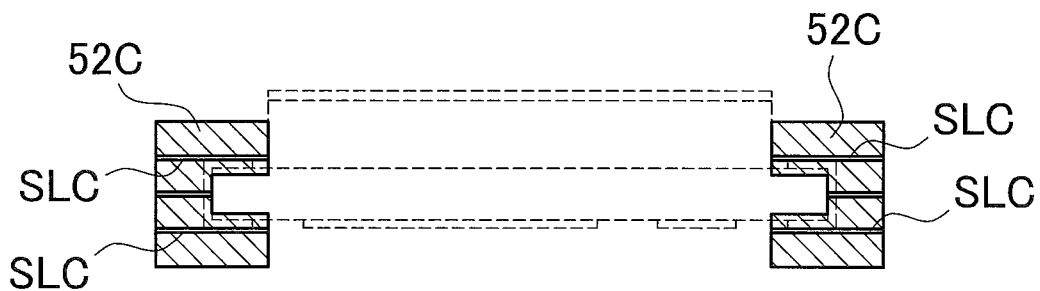
FIG. 14C is a plan view showing land patterns of a mounting substrate in a modification.
Figure 14D:
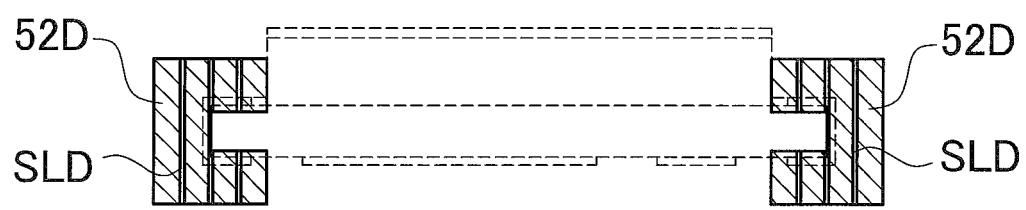
FIG. 14D is a plan view showing land patterns of a mounting substrate in a modification.
Figure 14E:
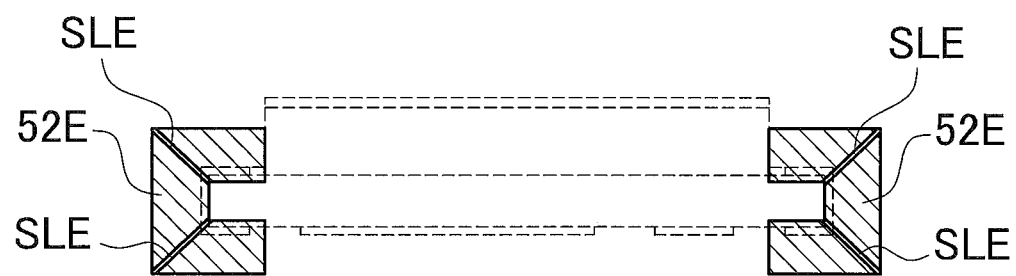
FIG. 14E is a plan view showing land patterns of a mounting substrate in a modification.
Figure 14F:
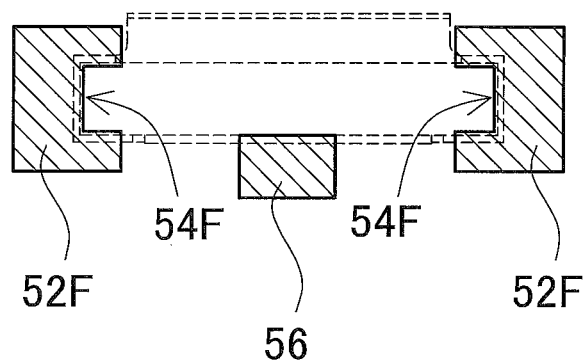
FIG. 14F is a plan view showing land patterns of a mounting substrate in a modification.
Figure 14G:
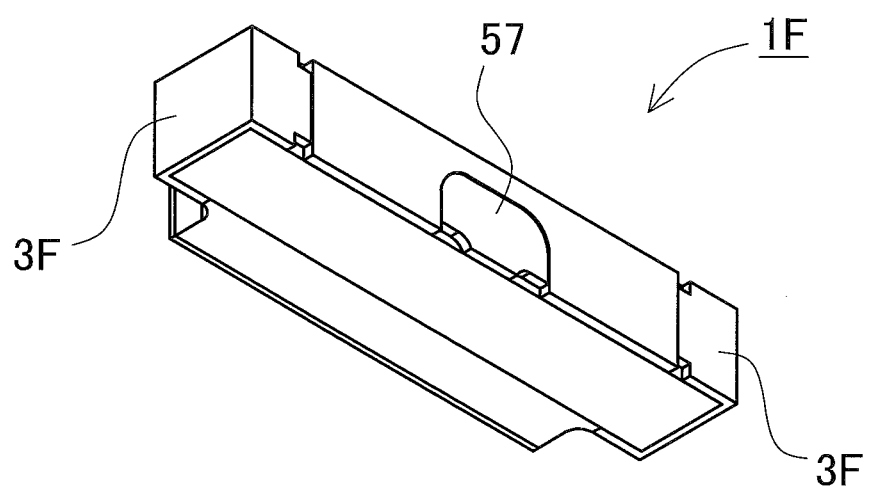
FIG. 14G is a perspective view of the semiconductor light emitting device in corresponding with the land pattern of FIG. 14F.

In the examples illustrated above, the linear region of the external connection terminal is formed in a U-shape, in other words, a rectangular shape with one side opened, but the embodiment of the present invention is not limited to this form. For example, the linear region may be formed of three continuous sides, or may be formed of two parallel sides. An example of such a configuration is shown in the plan view of FIG. 14 as the second embodiment. In this example, an external connection terminal 3B is disposed on each of the front side and the back side of side surfaces of a semiconductor light emitting device 1B. The pair of external connection terminals 3B are electrically connected to each other by a through hole (via or through-hole) formed in a base body 4. In a linear region 32B formed of a plurality of separated sides as described above, a self-alignment effect can be similarly exhibited by performing mounting in such a manner that a device-side mounting insulating region 34 surrounded by the linear region 32B corresponds to a land-side insulating region 54 formed on a land pattern 52. Further, the land pattern is not limited to the examples where it is formed in a U-shape which is a rectangular shape with one side opened as described above, and for example, as shown in FIG. 14B, a configuration in which two land patterns each having an L-shape in a plan view are arranged in a mirror image manner can also be employed. Other configurations, such as land patterns with one or more slits and/or grooves, or the like, can also be employed. For example, in an example shown in a planar view in FIG. 14C, a plurality of slits SLC extending in a vertical direction (in a lateral direction in FIG. 14C) to the bottom surface of the U-shaped opening are formed in the land pattern 52C. Also, as an example shown in a planar view in FIG. 14D, a plurality of slits SLD extending in a parallel direction (in a vertical direction in FIG. 14D) to the bottom surface of the U-shaped opening may be formed in the land pattern 52C. Also, as another example shown in a planar view in FIG. 14E, a plurality of slits SLE extending in an oblique direction from the both corners at the bottom surface of the U-shaped opening may be formed in the land pattern 52E. The width of each slit is preferably such that the portions of the land pattern separated by the slit can be connected with a solder, in other words, the solder can be spread through the slit. The number of the slit can be either plural or singular. Further, in the examples shown above, land patterns of configurations of surrounding both end portions of a semiconductor light emitting device are illustrated, but the land patterns are not limited to those configurations, other configurations with one or more additional land patterns may also be employed appropriately. For example, in the mounting substrate according to a modification shown in FIG. 14F, in addition to first land patterns 52F, a second land pattern 56 is further provided. The second land pattern 56 may be disposed along a line which connects corresponding open ends which are respectively defined by the land-side insulating regions 54F of a pair of the first land patterns 52F formed in the U-shape in a plan view. More specifically, the second land pattern 56 is disposed at a position along the line which connects corresponding open ends of the pair of the first land patterns 52F. That is, with an orientation in which the semiconductor light emitting device is positioned at its both ends by the first land patterns 52F, the semiconductor light emitting device is further positioned at an intermediate portion by the second land pattern 56. Accordingly, further precise positioning through the self-alignment can be achieved. Further, as shown in a perspective view in FIG. 14G, an auxiliary electrode 57 is disposed on the semiconductor light emitting device 1F side at a position corresponding to the second land pattern 56 in a mounting state on the mounting substrate. Bonding the auxiliary electrode 57 to the second land pattern 56 by a bonding material such a solder can provide positioning at an intermediate portion in addition to the positioning at the external connection terminals 3F disposed at the both end portions of the semiconductor light emitting device 1F, so that a further self-alignment effect can be exhibited. Also, with a bonding portion provided at an intermediate portion, a mechanical strength at the time of mounting the semiconductor light emitting device 1F on the mounting substrate can also be improved. The auxiliary electrode 57 is preferably disposed at a back-surface side of the semiconductor light emitting device 1F, that is at the side opposite from the light extracting surface. With this arrangement, self-alignment effect can be exhibited without disturbing emission of generated light by the auxiliary electrode. More preferably, the auxiliary electrode 57 is disposed at around a middle portion in the long-side direction of the semiconductor light emitting device 1F. With this arrangement, an improvement in the positioning effect in self-alignment and in the mechanical strength can be exhibited with a maximum efficiency.

(Backlight Device)

Figure 15:
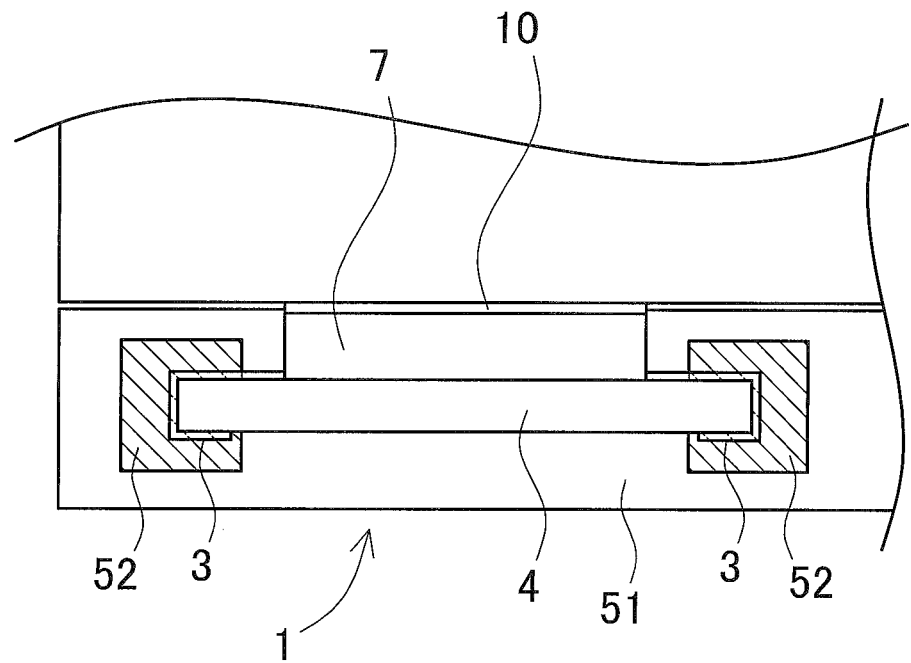
FIG. 15 is a plan view showing a state in which the semiconductor light emitting device in FIG. 5 is applied to a liquid crystal backlight device.
Figure 16:
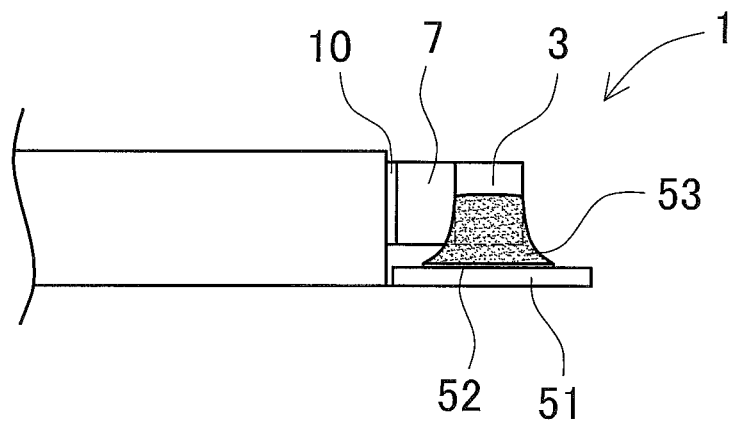
FIG. 16 is a side view of the liquid crystal backlight device in FIG. 15.

Such a semiconductor light emitting device can be suitably used for light sources for backlight in liquid crystal displays etc. As one example, the backlight device shown in the plan view of FIG. 15 and the side view of FIG. 16 is an edge light-type liquid crystal backlight device. This backlight device is a member configured to input light from an end surface of a light guide plate, and includes a mounting substrate 51, and a semiconductor light emitting device 1 mounted on the mounting substrate 51 with the light emitting surface facing the end surface of the light guide plate. Particularly in a thin panel in which the height of the semiconductor light emitting device 1 to be 0.5 mm or less, a side view-type package as shown in FIG. 19 is difficult to be used, and as shown in FIG. 1, in some cases, the planar metal region 31 cannot be faced to the mounting surface. Even in this case, with the above-described specific land pattern 52 provided with the land-side insulating region 54, self-alignment effect can be exhibited at the time of mounting of the semiconductor light emitting device 1, so that the yield can be improved. In this specification, the height of the semiconductor device refers to a height in a vertical direction in the orientation in mounting for the side surface light emission (side view) type semiconductor light emitting device as shown in FIG. 1.

Hereinafter, the members will be described in detail. The semiconductor light emitting device 1 is a light emitting device of side surface light emission type that is generally referred to as side view type. The side view-type semiconductor light emitting device 1 has, as a mounting surface, a surface neighboring a light extraction surface. The light emitting device includes a base body 4 provided with a pair of external connection terminals 3, a light emitting element 5, and a sealing member 7.

(Base Body 4)

The shape of the base body 4 is not particularly limited. For example, it is preferred that at least the first main surface includes a longitudinal direction, and a short direction intersecting or orthogonally crossing the longitudinal direction. The base body 4 has a thickness of, for example, a maximum of preferably about 500 µM or less, more preferably about 300 µm or less, further preferably about 200 µm or less. The maximum thickness is preferably about 40 µm or more.

The strength of the base body 4 can be adjusted according to the material of the base material, the material of the external connection terminal 3, and so on to be described below. For example, within the above-described thickness range, the flexural strength is preferably 300 MPa or more, more preferably 400 MPa or more, further preferably 600 MPa or more. The strength of the light emitting device can be accordingly secured. The flexural strength in the present specification refers to a value measured by using a commercially available strength measuring apparatus, for example, by a three-point flexural test using an Instron machine.

With a thin base body 4 of suitable strength as described above, a light emitting device which is small and thin and has high performance and high reliability can be obtained.

The base material that forms the base body 4 may be formed of any material that has a linear expansion coefficient within ±10 ppm/° C. with respect to the linear expansion coefficient of the light emitting element 5 to be described below. Preferably, the linear expansion coefficient of the base material is in a range of ±9 ppm/° C., ±8 ppm/° C., ±7 ppm/° C. or ±5 ppm/° C. with respect to the linear expansion coefficient of the light emitting element 5. Accordingly, detachment of the light emitting element 5 from the base body 4 (external connection terminal 3) or undesired stress loading on the light emitting element 5 due to a difference in linear expansion coefficient between the light emitting element 5 and the base body 4, which have been problems, can be effectively prevented at the time of mounting the light emitting element 5 on the base body 4. Accordingly, electrodes of the light emitting element 5 can be directly connected to the external connection terminals 3 of the base body 4 by flip-chip mounting, so that a smaller and thinner light emitting device can be provided. In the embodiment of the present invention, the linear expansion coefficient means a value measured by the TMA method. While either one of α1 and α2 should satisfy the above-mentioned criteria, it is more preferred that both α1 and α2 satisfy the criteria.

Examples of the base material include metals, ceramics, resins, dielectric materials, pulp, glass and paper or composite materials thereof (e.g. composite resins), or composite materials of the above-mentioned materials and conductive materials (e.g. metals, carbon etc.). Examples of the metal include copper, iron, nickel, chromium, aluminum, silver, gold and titanium or those including alloys thereof. Examples of the ceramic include aluminum oxide, aluminum nitride, zirconium oxide, zirconium nitride, titanium oxide and titanium nitride or those including mixtures thereof. Examples of the composite resin include glass epoxy resins.

Particularly, the base material preferably contains a resin. Any resin used in the art can be used. Particularly, in order to obtain the linear expansion coefficient of the base material in a range of ±10 ppm/° C. with respect to the linear expansion coefficient of the light emitting element 5, a resin having a small linear expansion coefficient is preferably used. Specific examples include epoxy resins, bismaleimide-triazine (BT) resins, polyimide resins, cyanate resins, polyvinyl acetal resins, phenoxy resins, acrylic resins, alkyd resins and urethane resins. For example, resins described in JP 2013-35960 A, WO 2011/132674, WO 2012/121224, WO 2012/165423 and the like, BT resins containing a naphthalene-based epoxy resin and compositions thereof, commercial products (e.g. H1832NS and HL832NSF type LCA manufactured by Mitsubishi Gas Chemical Company, Inc.; MCL-E-700G and MCL-E-705G manufactured by Hitachi Chemical Company, Ltd.; and the like), and liquid crystal polymers described in JP 2010-114427 A and compositions thereof may be used. They may contain additives, monomers, oligomers, prepolymers and the like which are known in the art. Among these, BT resins or their compositions are preferred.

For example, the resin has a glass transition temperature of preferably about 250° C. or higher, more preferably about 270° C. or higher, about 280° C. or higher, about 300° C. or higher, about 320° C. or higher irrespective of the type of the resin. From a different point of view, the glass transition temperature is preferably equal to or higher than the melting temperature of solder that is a bonding member used for connecting the light emitting element 5 to the external connection terminal 3 as will be described below. The term "equal" herein means that a variation of about 5° C. is tolerated. Accordingly, defects such as a connection failure of the light emitting element 5 can be avoided, without being affected by a temperature change in mounting of the light emitting element 5. As a result, the production yield of the light emitting device can be improved. The glass transition temperature may be measured by, for example, either a method (TMA, DSC, DTA or the like) in which a change in dynamic properties and heat absorption or heat generation are measured while the temperature of a sample is slowly elevated or lowered, or a method in which a response of a dynamic viscoelasticity measurement sample is measured while the frequency of a periodic force applied to the sample is changed.

The resin has a heat emissivity of preferably 0.5 or more, more preferably 0.6 of more. With the heat emissivity as described above, heat from the light emitting element 5 can be efficiently released, so that the life of the light emitting device can be improved. The heat emissivity in the present specification refers to a value measured by an emissivity measurement device (e.g. TSS-5X manufactured by Japan Sensor Corporation).

In order to obtain a linear expansion coefficient within ±10 ppm/° C. with respect to the linear expansion coefficient of the light emitting element 5, or to increase the heat emissivity, irrespective of the type of the resin, it is preferred that a filler, for example a filler made of an inorganic material is contained in the resin. By appropriately combining the type and amount of the filler, the linear expansion coefficient of the base material can be adjusted.

Examples of the filler and inorganic material include borate particles covered with hexagonal boron nitride, alumina, silicas (natural silica, fused silica, etc.), metal hydrates (aluminum hydroxide, boehmite, magnesium hydroxide, etc.), molybdenum compounds (molybdenum oxide, etc.), zinc borate, zinc stannate, aluminum oxide, clay, kaolin, magnesium oxide, aluminum nitride, silicon nitride, talc, baked clay, baked kaolin, baked talc, mica, glass short fibers (glass fine powders such as those of E glass and D glass, glass cloths, etc.), hollow glass, heat-shrinkable fillers such as zirconium phosphate, rubber powders such as styrene-based, butadiene-based, acrylic and silicone rubber powders, and core-shell type rubber powders (styrene-based, butadiene-based, acrylic and silicone-based rubber powders, etc.). Particularly, by including a large amount of filler or inorganic material having high heat conductivity, the heat emissivity can be adjusted. For example, in the case of using a glass cloth, an inorganic material in the glass cloth can be included in an amount of 50% by weight or more, 70% by weight or more, or 90% by weight or more.

The resin may contain a pigment. Examples of the pigment include carbon black and titanium oxide. Particularly, as described above, a mounting surface that is a surface neighboring a light extraction surface and a surface opposite to the mounting surface in a side view type light emitting device, the base material preferably has a black color. Accordingly, stray light associated with light emitted from the light emitting device or reflected light thereof can be absorbed. Further, by absorption of stray light of the base material or the base body 4, variations in color and/or brightness of light, etc. can be suppressed to improve quality in, for example, backlight applications. By absorption of stray light, photodegradation of peripheral members can be suppressed. Particularly in a light emitting device having a small size as in the embodiment of the present invention, the light emitting element 5 is relatively large with respect to the light emitting device, and therefore the light emitting device may excessively generate heat due to heat generation from the light emitting element 5, Stokes heat generation by a phosphor, or the like. Such heating may have adverse effects such as degradation and deformation of a light guide plate of a backlight device. Thus, by including a black filler having a large heat emissivity coefficient, such as carbon black, in the base material (resin), heat from the light emitting element and the phosphor can be released.

The linear expansion coefficient of the base material, depending on the type, the structure and the like of the light emitting element 5 used, is, for example, preferably about 20 ppm/° C. or less, more preferably about 10 ppm/° C. or less, more preferably about 8 ppm/° C. or less, about 7 ppm/° C. or less, or about 6 ppm/° C. or less. With the base material of linear expansion coefficient described above, the linear expansion coefficient of the base body 4 can be controlled. Accordingly, as described below, even in the case of mounting the light emitting element 5 in a flip-chip manner, the light emitting element 5 can be strongly connected to the base body 4 despite a temperature change in the production process etc., so that defects such as a connection failure of the light emitting element 5 can be avoided. As a result, the production yield of the light emitting device can be improved.

The shape, size, thickness and the like of the base material in one light emitting device are not particularly limited, and may be appropriately set. The thickness of the base material, depending on the material used, the type and the structure of the light emitting element 5 placed, and the like, is, for example, preferably about 470 μm or less, more preferably about 370 μm or less, about 320 μm or less, about 270 μm or less, about 200 μm or less, about 150 μm or less or about 100 μm or less. The thickness of the base material is preferably about 20 μm or more in view of the strength and so on. The flexural strength of the base material is preferably equal to the strength of the base body 4 described above, for example about 300 MPa or more, more preferably about 400 MPa or more or about 600 MPa or more for securing the strength of the overall base body 4.

The plane shape of the base material is, for example, a circle, a polygon such as a quadrangle, or a shape close thereto. Among these, a rectangle, i.e. a shape that is narrow and long in the longitudinal direction is preferred. The size is preferably larger than the later-described light emitting element 5 in terms of plane area. In the case where one light emitting element 5 is mounted on one light emitting device, the length of the light emitting device in the longitudinal direction is preferably about 1.5 to 5 times, more preferably about 1.5 to 3 times the length of one side of the light emitting element 5. The length of the light emitting device in the short direction is preferably about 1.0 to 2.0 times, more preferably about 1.1 to 1.5 times the length of one side of the light emitting element 5. In the case where a plurality of light emitting elements 5 are mounted on one light emitting device, the length of the light emitting device can be adjusted according to the number of the light emitting elements 5. For example, in the case of mounting 2 or 3 light emitting elements 5 in the longitudinal direction, the length of the light emitting device in the longitudinal direction is preferably about 2.4 to 6.0 times or about 3.5 to 7.0 times the length of one side of the light emitting element 5.

On the second main surface of the base material, one or more layers having functions of reinforcement, heat release, a mark for alignment and so on may be provided using an insulator, a metal and the like.

(External Connection Terminal 3)

A pair of external connection terminals 3 should be formed on at least the first main surface and second main surface of the base body 4. In this case, it is preferred that at least a part of the edge of the external connection terminal 3 coincides with a part of the edge of the first main surface of the base body 4. In other words, it is preferred that a part of the end surface of the external connection terminal 3 and a part of the mounting surface of the base body 4 are in the same plane. Accordingly, the mounting substrate 51 and the end surface of the external connection terminal 3 can be brought into contact with (or made as closer as possible to) each other in mounting of the light emitting device on the mounting substrate 51, and therefore mountability of the light emitting device can be improved. Here, the term "same plane" means that there is no or almost no step difference, and means that irregularities of several µm to several tens µm are tolerated. In this specification, the term "same plane" has the same meaning hereinafter.

The external connection terminal 3 has on the first main surface an element connection section connected to the electrode of the light emitting element 5 and an external connection section connected to the outside of the light emitting device. It is preferred that the external connection section is provided on the second main surface of the base body 4 in addition to the first main surface of the base body 4. For example, it is preferred that the external connection terminal 3 is (i) provided so as to extend from the first main surface onto a surface present between the first main surface and the second main surface, (ii) provided so as to extend from the first main surface onto the second main surface through a via or a through-hole etc. provided so as to extend through the base material, or (iii) provided (e.g. in a U-shape in cross-sectional view) so as to extend from the first main surface onto the second main surface by passing over a surface present between the first main surface and the second main surface. Here, the surface present between the first main surface and the second main surface may refer to a part or the whole of two or more end surfaces present between the first main surface and the second main surface.

Usually, the element connection section is disposed on the first main surface, and the external connection section is disposed on (i) the first main surface, (ii) the first main surface and the end surface, (iii) the first main surface, the end surface and the second main surface, or (iv) the first main surface and the second main surface.

The external connection terminal 3 is not necessarily required to have the same width (e.g. length of the base body 4 in the short direction) over the first main surface, the end surface and/or the second main surface of the base body 4, and may be formed so as to be only partially reduced or increased in width. Alternatively, the external connection terminal 3 may be partially covered with an insulating material (e.g. base material) so as to be reduced in width at the first main surface and/or the second main surface of the base body 4. Such a width-reduced region is preferably disposed on at least the first main surface of the base body 4, and may be disposed on both the first main surface and the second main surface. Particularly, it is more preferred that on the first main surface of the base body 4, the width-reduced region is arranged in the vicinity of the later-described sealing member 7.

By disposing such a width-reduced region, a situation can be suppressed in which solder, etc. which is connected to the external connection terminal 3, or flux or the like contained therein penetrates to below the later-described sealing member 7 and further to below the light emitting element 5 along the surface of the terminal. By separating the element connection section from the end surface along the longitudinal direction of the base body 4, a situation can be suppressed in which solder etc., or flux or the like contained therein penetrates to below the sealing member 7 and further to below the light emitting element 5 along the surface of the terminal at the time of mounting the light emitting element 5.

The width-reduced region is preferably smaller in width than the element connection section. The width-reduced region is preferably gently reduced in width.

The base body may have a heat releasing terminal, a heat sink, a reinforcement member and so on in addition to the external connection terminal 3 electrically connected to the light emitting element 5. They may be disposed on any of the first main surface, the second main surface and the end surface, and in particular, preferably disposed below the light emitting element 5 and/or the sealing member 7. The strength and reliability of the light emitting device can be accordingly enhanced. By enhancing the strength of the base body, distortion of the base body 4 is reduced, so that moldability of the sealing member 7 can be improved in the case of forming the sealing member 7 using a mold. In the case where the heat releasing terminal or reinforcement terminal is conductive, and is provided between a pair of external connection terminals 3, it is preferred that the heat releasing terminal or reinforcement terminal is covered with an insulating film. Bridging of solder with the external connection terminal 3 and the heat releasing terminal or reinforcement terminal can be accordingly prevented.

Further, in the case where a plurality of light emitting elements 5 are disposed in one light emitting device, the light emitting device may include one or more additional external connection terminals for electrically connecting the plurality of light emitting elements 5. The shape, position and the like of the external connection terminals can be appropriately set according to the number of light emitting elements 5 mounted on one base body 4, and the arrangement and connection form (parallel or series) thereof, etc.

The external connection terminal 3 can be formed from, for example, a single-layer film or laminated film of a metal such as Au, Pt, Pd, Rh, Ni, W, Mo, Cr, Ti, Fe, Cu, Al or Ag, or an alloy thereof. Among these, one excellent in conductivity and mountability is preferred, and a material having good bondability and wettability with solder on the mounting side is more preferred. Particularly, copper or a copper alloy is preferred from the viewpoint of heat releasability. A film having a high light reflectivity, such as that of silver, platinum, tin, gold, copper, rhodium or an alloy thereof may be formed on the surface of the external the connection terminal 3. Specific examples of the structure of the external connection terminal 3 include laminated structures such as W/Ni/Au, W/Ni/Pd/Au, W/NiCo/Pd/Au, Cu/Ni/Cu/Ni/Pd/Au, Cu/Ni/Pd/Au, Cu/Ni/Au, Cu/Ni/Ag and Cu/Ni/Au/Ag. The thickness or the number of layers may partially vary.

The external connection terminals 3 may each be substantially flat or have irregularities on a surface connected to the light emitting element 5, i.e. the first main surface. The external connection terminals 3 may each have a projecting pattern at a position opposite to each of the electrodes of the light emitting element 5 to be described below. Preferably, the projecting pattern has a size comparable to that of the electrode of the light emitting element 5. Preferably, the external connection terminal 3 and the projecting pattern are horizontal to a surface of the base body 4 (surface connected to the light emitting element 5) so that the light emitting surface can be made horizontal in the case where the light emitting element 5 is mounted on the base body 4. The projecting pattern can be prepared by, for example, an additive method, a semi-additive method or an etching method using photolithography such as a subtractive method.

For the external connection terminal 3, a wire, a lead frame or the like may be used, but it is preferred to form a film of the above-described material by plating or the like so that the external connection terminal 3 is substantially flat on the surface of the base body 4 or forms the same plane with the base body 4. In this case, the thickness of the external connection terminal 3 is several µm to several tens µm. Particularly, it is preferred to form the projecting pattern by laminating plating. The thickness of the projecting pattern is several µm to several tens µm from the other region on the surface of the external connection terminal 3.

As long as the linear expansion coefficient of the base material described above is not considerably impaired, the base body 4 may form a protective element such as a capacitor, a varistor, a Zener diode or a bridge diode, or may include a structure, which performs the function of these elements, as a part thereof in the form of, for example, a multilayer structure or a laminated structure. By using one that performs the above-mentioned element function, the base body 4 can be made to function as a light emitting device without additionally carrying components. As a result, a high-performance light emitting device having improved electrostatic withstand voltage can be made smaller.

(Light Emitting Element 5)

The light emitting element 5 is mounted on the base body 4, and connected to the external connection terminal 3 on the first main surface at the first main surface of the base body 4. One light emitting element 5, or a plurality of light emitting elements 5 may be mounted on one light emitting device. The size, shape and light emitting wavelength of the light emitting element 5 can be appropriately selected. In the case where a plurality of light emitting elements 5 are mounted, they may be disposed irregularly, or may be disposed regularly in the form of a matrix or the like, or periodically. A plurality of light emitting elements 5 may be connected in any form of series connection, parallel connection, series-parallel connection or parallel-series connection.

Preferably, the light emitting element 5 includes at least a nitride semiconductor laminate. The nitride semiconductor laminate is formed by laminating a first semiconductor layer (e.g. n-type semiconductor layer), a light emitting layer and a second semiconductor layer (e.g. p-type semiconductor layer) in this order, and contributes to light emission. The thickness of the nitride semiconductor laminate is preferably about 30 µm or less, more preferably about 15 µm or less or about 10 µm or less. Preferably, the nitride semiconductor laminate has, on the same surface (e.g. surface on the second semiconductor layer side) thereof, both a first electrode (positive or negative) electrically connected to the first semiconductor layer and a second electrode (negative or positive) electrically connected to the second semiconductor layer. An ohmic electrode, a metal film, an electrode for external connection, and so on are included as components that form the first electrode and the second electrode.

The type and the material of the first semiconductor layer, the light emitting layer and the second semiconductor layer are not particularly limited, and examples include various semiconductors such as group III-V compound semiconductors and group II-VI compound semiconductors. Specific examples include nitride-based semiconductor materials such as $In_XAl_YGa_{1-X-Y}N$ ($0 \leq X$, $0 \leq Y$, $X+Y \leq 1$), and InN, AlN, GaN, InGaN, AlGaN, InGaAlN and the like can be used. For the film thickness and the layer structure of each layer, those known in the art can be used.

The nitride semiconductor laminate is usually laminated on a growth substrate of a semiconductor layer. Examples of the growth substrate of a semiconductor layer include those capable of epitaxially growing a semiconductor layer. Examples of the material of the substrate include insulating substrates such as those of sapphire ($Al_2O_3$) and spinel ($MgAl_2O_4$), and the above-described nitride-based semiconductor substrates. The thickness of the substrate is preferably about 190 µm or less, more preferably about 180 µm or less or about 150 µm or less.

The substrate may have a plurality of projecting portions or irregularities on a surface thereof. A surface of the nitride semiconductor laminate on the substrate side (surface opposite to a surface of the nitride semiconductor laminate on which the electrodes are disposed) may accordingly have a plurality of projecting portions or irregularities. The irregularities originate from the shape of the substrate, and may have such a surface roughness that, for example, the height is about 0.5 to 2.0 and the pitch is about 10 to 25 µm. The substrate may have an off angle of about 0 to 10° with respect to a predetermined crystal plane such as the C plane or the A plane. The substrate may have a semiconductor layer, an insulating layer or the like as an intermediate layer, a buffer layer, an under-layer or the like between the substrate and the first semiconductor layer.

The growth substrate of a semiconductor layer can be used for the light emitting device without being removed from the semiconductor laminate in the case where a substrate having light transmissivity, such as a sapphire substrate is used. Alternatively, such a substrate may be removed from the semiconductor laminate. The growth substrate can be removed using a laser lift-off method etc. Specifically, from the substrate side, the semiconductor layer is irradiated with laser light (e.g. KrF excimer laser) that passes through the substrate, so that a decomposition reaction is caused to occur at an interface between the semiconductor layer and the substrate to remove the substrate from the semiconductor layer. It is to be noted that the growth substrate may slightly remain at the end or the corner of the semiconductor layer besides the substrate completely removed from the semiconductor layer. The growth substrate can be removed before or after the light emitting element 5 is mounted on the base body 4.

In the case where the nitride semiconductor laminate is freed of the growth substrate of a semiconductor layer, a light emitting device that is thinner and smaller can be obtained. By removing a layer that does not directly contribute to light emission, absorption of light emitted from the light emitting layer, which is caused by the above-mentioned layer, can be inhibited. Further, scattering of light caused by the substrate can be inhibited. Accordingly, luminous efficiency can be further improved. As a result, the luminance can be enhanced.

The light emitting element 5 may have a laminated structure known as so called vertical dice or laminated dice, for example a laminated structure as described in JP 2008-300719 A or JP 2009-10280 A.

The shape of the light emitting element in plan view is not particularly limited, and is preferably a quadrangle or a shape very close thereto. The upper limit of the size of light emitting element can be appropriately adjusted according to the size of the light emitting device. The length of one side of the light emitting element is, for example, about 100 µm to 2 mm, and the size is preferably about 1400×200 µm, about 1100×200 µm or about 900×200 µm.

The light emitting element 5 is preferably one having good linearity with no waves and burrs present on the side surface and the upper surface thereof. Accordingly, cracks of the light emitting element by minute external forces or the like caused by these waves and burrs can be reduced. For example, the surface roughness Ra of the upper surface of the light emitting element 5 is preferably 15 nm or less, for example about 10 to 15 nm. The surface roughness Ra of the side surface of the light emitting element 5 is preferably 2 µm or less, further preferably 1.0 µm or less or 0.5 µm or less. Particularly, the surface roughness Ra of the side surface of the light emitting element 5 is preferably 0.3 µm or less, more preferably 0.2 µm or less. The surface roughness Ra refers to a value obtained by a measurement method conforming to, for example, JIS B060, '01/ISO 4287 or the like.

(First Electrode and Second Electrode)

Preferably, the first electrode and the second electrode are formed on the same surface (surface opposite to the substrate in the presence of the substrate) of the semiconductor laminate. Accordingly, flip-chip mounting can be performed with the positive and negative external connection terminals 3 of the base body 4 made opposite to the first electrode and the second electrode of the light emitting element 5.

The first electrode and the second electrode can be formed from, for example, a single-layer film or laminated film of a metal such as Au, Pt, Pd, Rh, Ni, W, Mo, Cr or Ti, or an alloy thereof. Specific examples include laminated films laminated like Ti/Rh/Au, W/Pt/Au, Rh/Pt/Au, W/Pt/Au, Ni/Pt/Au and Ti/Rh from the semiconductor layer side. The film thickness may be any thickness of films that are used in the art.

In the first electrode and the second electrode, on sides close to the first semiconductor layer and the second semiconductor layer, respectively, it is preferred that each electrode is provided with, as a part of the electrode, a material layer having a higher reflectivity to light emitted from the light emitting layer as compared to other materials of the electrode. Examples of the high-reflectivity material include layers containing silver or a silver alloy or aluminum. As the silver alloy, any of the materials known in the art may be used. The thickness of the material layer is not particularly limited, and examples include such a thickness that light emitted from the light emitting element 5 can be effectively reflected, for example about 20 nm to 1 µm. The contact area of the high-reflectivity material layer with the first semiconductor layer or the second semiconductor layer is preferably as large as possible.

When silver or a silver alloy is used, it is preferred to form a covering layer that covers a surface (preferably the upper surface and the end surface) of the material layer for preventing migration of silver.

The above-mentioned covering layer should be one formed of a metal or an alloy that is usually used as a conductive material, and the covering layer is, for example, a single layer or a laminated layer containing a metal such as aluminum, copper or nickel. Among these, it is preferred to use AlCu. The thickness of the covering layer is about several hundred nm to several µm for effectively preventing migration of silver.

As long as the first electrode and the second electrode are electrically connected to the first semiconductor layer and the second semiconductor layer, respectively, the entire surface of the electrode is not required to be in contact with the semiconductor layer, or the first electrode is not required to be situated wholly on the first semiconductor layer and/or the second electrode is not required to be situated wholly on the second semiconductor layer. That is, for example, the first electrode may be disposed on the second semiconductor layer or the second electrode may be disposed on the first semiconductor layer with an insulating film etc. interposed therebetween. Accordingly, the shape of the first electrode or the second electrode at a connection part with the element connection section can be easily changed, and therefore the electrodes can be easily mounted on a pair of external connection terminals 3.

The insulating film herein is not particularly limited, and may be any of the single-layer films and laminated films that are used in the art. By using an insulating film etc., the first electrode and the second electrode can be set at any size and position irrespective of the plane area of the first semiconductor layer, and/or the second semiconductor layer.

The shape of each of the first electrode and the second electrode can be set according to the shape of the semiconductor laminate, the shape of the external connection terminal 3 (more specifically the element connection section) of the base body 4, or the like. Preferably, the first electrode, the second electrode and the element connection section each have a quadrangle shape in plan view or a shape close thereto. With forming the shape of each of the first electrode and the second electrode substantially the same as the shape of the corresponding element connection section, bonding and registering of the semiconductor laminate with the base body 4 can be easily performed by making use of a self-alignment effect. In this case, it is preferred that the plane shapes of the first electrode and the second electrode are substantially the same at least at the outermost surface of the semiconductor laminate connected to the base body 4. Preferably, the first electrode and the second electrode are disposed with the central part of the semiconductor laminate held therebetween.

The first main surface (surface opposite to the semiconductor layer) of each of the first electrode and the second electrode may have a step difference, but is preferably substantially flat. The term "flat" herein means that the height from the second main surface (surface opposite to the first main surface) of the semiconductor laminate to the first main surface of the first electrode is substantially the same as the height from the second main surface of the semiconductor laminate to the first main surface of the second electrode. The term "substantially the same" herein means that a variation of about ±10% in height of the semiconductor laminate is tolerated.

With forming the first main surface of each of the first electrode and the second electrode substantially flat, i.e. both the electrodes are disposed on substantially the same plane as described above, the light emitting element 5 is easily mounted on the base body 4 horizontally. Formation of the above-mentioned first electrode and second electrode can be performed by, for example, providing a metal film by plating etc., and then polishing or cutting the metal film to be flattened.

A DBR (distribution Bragg reflector) layer etc. may be disposed between the first electrode and the second electrode and between the first semiconductor layer and the second semiconductor layer within the bounds of not hindering electrical connection between the electrode and the semiconductor layer. For example, the DBR layer has a multi-layer structure in which a low-refractive-index layer and a high-refractive-index layer are laminated on an under-layer optionally including an oxide film etc., and the DBR layer selectively reflects light having a predetermined wavelength. Specifically, films having different refractive indexes are alternately laminated in a thickness of ¼ wavelength, accordingly light having a predetermined wavelength can be reflected with high efficiency. The DBR layer can be formed using as a material an oxide or a nitride of at least one selected from the group consisting of Si, Ti, Zr, Nb, Ta and Al.

The thickness of the light emitting element 5 is preferably 200 µm or less, more preferably 180 µm or less or 150 µm or less as a thickness including the electrode irrespective of presence/absence of the growth substrate of a semiconductor. The thickness of only the nitride semiconductor laminate freed of the substrate is preferably 20 µm or less, more preferably 15 µm or less or 10 µm or less.

The light emitting element 5 may have a reinforcement layer disposed on a surface of the nitrogen semiconductor laminate on which positive and negative electrodes are disposed. The reinforcement layer herein may be formed of any material selected from an insulator, a semiconductor and a conductor as long as it is a layer capable of reinforcing the strength of the nitride semiconductor laminate. The reinforcement layer may be either a single layer or laminated layer as a whole, or single layers or laminated layers disposed at a plurality of locations. The reinforcement layer may be a layer, a part of which secures insulation quality, conductivity and the like that are essential to the functions of the light emitting element 5. Particularly, some of films that are used for forming the light emitting element 5 may be thickened. Specifically, conductive layers that function as electrodes etc. may be thickened by a known method such as plating or sputtering. An interlayer insulating film, a surface protective film and the like disposed between these layers may be thickened. Accordingly, an increase in size of the light emitting device can be prevented with no unnecessary layers disposed while a moderate strength is secured.

For example, from one point of view, a layer other than the nitride semiconductor laminate and positive and negative electrodes that form the light emitting element 5, and insulating layers that are optionally formed between these components for the purpose of electric insulation, protection and the like, the layer being on the base body 4 side from the positive and negative electrodes, can be made to function as a reinforcement layer. From another point of view, minimum layers needed to function as the light emitting element 5 can be thickened, and accordingly made to function as reinforcement layers. Further, layers additionally provided on these layers can be made to function as reinforcement layers. For these layers to function as reinforcement layers, the total volume of layers composed of metal materials is adjusted to be preferably about 5 to 95%, more preferably about 10 to 70% or about 15 to 50% based on the total volume of components other than the growth substrate of a semiconductor layer, such as a nitride semiconductor laminate, electrodes, an insulating protective film and a resin layer filling a gap between the electrodes. Further, from another point of view, a reinforcement layer including a conductive layer that is not connected to electrodes of the light emitting element 5, an insulating layer for insulating the conductive layer from the electrodes, a protective layer for protecting the conductive layer, and a conductive layer, an insulating layer and a protective layer etc. for the above-mentioned layers can be made to function as reinforcement layers. The total thickness of these reinforcement layers at the thinnest region is preferably about 1 µm or more, more preferably about 3 µm or more, 5 µm or more, or 10 µm or more. By providing reinforcement layers having a moderate thickness, an increase in size/thickness of the element can be minimized while the strength of the light emitting device is secured.

Preferably, the light emitting element 5 is flip-chip-mounted on the base body 4. In this case, the first electrode and the second electrode are usually bonded to the external connection terminals 3 of the above-described base body 4 by a bonding member. For such a bonding member, any of the materials known in the art can be used, and examples include conductive solder. Specific examples include tin-bismuth-based solder, tin-copper-based solder, tin-silver-based solder, gold-silver-based solder and the like (specifically, alloys having Ag, Cu and Sn as main components, alloys having Cu and Sn as main components, alloys having Bi and Sn as main components, and the like), eutectic alloys (alloys having Au and Sn as main components, alloys having Au and Si as main components, alloys having Au and Ge as main components, and the like), conductive pastes of silver, gold, palladium and the like, bumps, anisotropic conductive materials, and brazing materials such as low-melting-point metals. Particularly, with the use of solder, along with the shape of the above-described external connection terminal 3, and the position and size of the projecting pattern, a high-accuracy self-alignment effect can be exhibited. Accordingly, the light emitting element 5 is easily mounted in the right place, so that mass productivity can be improved, and smaller light emitting devices can be produced. In the case where the growth substrate is removed, it is preferred to use an anisotropic conductive paste or an anisotropic conductive film. In the case where the light emitting element 5 is fixed to the external connection terminal 3, solder is set to have a thickness that is preferably about 1 to 3 times the thickness of the nitride semiconductor laminate. Accordingly, a further high-accuracy self-alignment effect can be exhibited. Accordingly, the light emitting element 5 is easily mounted in the right place, so that mass productivity can be improved, and smaller light emitting devices can be produced. In the case where the growth substrate is removed, it is preferred to use an anisotropic conductive paste or an anisotropic conductive film. In the case where the light emitting element 5 is fixed to the external connection terminal 3, solder is set to have a thickness that is preferably about ¼ to 3 times, more preferably about 1 to 3 times the thickness of the nitride semiconductor laminate. Accordingly, a further high-accuracy self-alignment effect can be exhibited, so that the light emitting device can be made smaller and thinner. For example, the thickness of solder is preferably about 2 to 50 µm, more preferably about 5 to 30 µm.

(Sealing Member 7)

The sealing member 7 is a member having a function of sealing (covering) at least a part of the light emitting element 5 or fixing the light emitting element 5 to the base body. The material of the sealing member 7 is not particularly limited, and examples include ceramics, resins, dielectric materials, pulp, glass and composite materials thereof. Among these, resins are preferred because they can be easily molded into any shape.

Examples of the resin include thermosetting resins, thermoplastic resins, modified resins thereof and hybrid resins containing at least one of these resins. Specific examples include resins such as epoxy resin compositions, modified epoxy resin compositions (silicone-modified epoxy resins etc.), silicone resin compositions, modified silicone resin compositions (epoxy-modified silicone resins etc.), hybrid silicone resins, polyimide resin compositions, modified polyimide resin compositions, polyamide resins, polyethylene terephthalate resins, polycyclohexane terephthalate resins, polyphthalamide (PPA), polycarbonate resins, polyphenylene sulfide (PPS), liquid crystal polymers (LCP), ABS resins, phenol resins, acrylic resins, PBT resins, urea resins, BT resins and polyurethane resins.

The linear expansion coefficient and the glass transition temperature etc. of the resin used in the sealing member 7 are not particularly limited, and for example, the linear expansion coefficient is preferably about 100 ppm/° C. or less, more preferably about 80 ppm/° C. or less or about 60 ppm/° C. or less, and the glass transition temperature is preferably 100° C. or lower, more preferably 75° C. or lower or 50° C. or lower.

The sealing member 7 may be light transmissive, but is more preferably a light shielding material having a reflectivity of 60% or more, 70% or more, 80% or more or 90% or more to light from the light emitting element 5.

Thus, it is preferred that the above-described material, e.g. a resin contains, for example, a light reflection material, a light scattering material or a colorant such as titanium dioxide, silicon dioxide, zirconium dioxide, potassium titanate, alumina, aluminum nitride, boron nitride, mullite, niobium oxide, zinc oxide, barium sulfate, carbon black and various kinds of rare earth oxides (e.g. yttrium oxide and gadolinium oxide), a heat radiation member, and so on.

The sealing member 7 may contain a fibrous filler such as glass fibers or wollastonite, or an inorganic filler such as carbon. The sealing member may contain a material having high heat releasability (e.g. aluminum nitride etc.). Further, the sealing member 7 may contain the later-described phosphor. Preferably, the sealing member 7 contains these additives in an amount of, for example, about 10 to 95% by weight, about 20 to 80% by weight or about 30 to 60% by weight based on the total weight of the sealing member 7.

With the sealing member 7 containing a light reflection material, light from the light emitting element 5 can be efficiently reflected. Particularly, by using a material having a light reflectivity higher than that of the base body 4 (for example, by using a silicone resin containing titanium dioxide as the sealing member 7 in the case of using aluminum nitride for the base body 4), light extraction efficiency of the light emitting device can be enhanced by reducing the size of the base body 4 while handling characteristics are retained. In the case where the sealing member 7 contains only titanium dioxide as a light reflection material, it contains the light reflection material in an amount of preferably about 20 to 60% by weight, more preferably about 30 to 50% by weight based on the total weight of the sealing member 7.

With the light emitting device having the sealing member 7, the strength of the sealing member 7 at the time of a process such as removal or peeling of a growth substrate or a support of the semiconductor layer can be improved. Further, the strength of the whole light emitting device can be secured. By forming the sealing member 7 from a material having high heat releasability, heat releasability can be improved while the light emitting device is kept small.

The outer shape of the sealing member 7 is not particularly limited, and may be, for example, a cylindrical shape, a polygonal prism shape such as a quadrangular prism shape or a shape close thereto, a circular truncated cone shape, a polygonal truncated cone shape such as a quadrangular truncated cone shape, or a lens shape in part. Among these, the sealing member 7 preferably has a shape that is narrow and long in the longitudinal direction of the base body 4. The sealing member 7 preferably has a surface extending along the short direction of the base body 4.

The sealing member 7 is preferably disposed in contact with a part or the whole of at least one side surface of the light emitting element 5 so as to cover the side surface of the light emitting element 5, or preferably disposed in contact with the light emitting element 5 so as to surround the entire periphery of the light emitting element 5. In this case, it is preferred that the sealing member 7 is provided so as to be thick at the side surface on the longitudinal direction side of the light emitting device, and thin at the side surface on the short direction side of the light emitting device. The light emitting device can be accordingly made thinner. Preferably, the sealing member 7 is provided so as to fill a gap between the mounted light emitting element 5 and the base body 4. The strength of the light emitting device can be accordingly enhanced. The sealing member 7 disposed between the light emitting element 5 and the base body 4 may be a material different from the material covering the side surface of the light emitting element 5. Accordingly, suitable functions can be imparted to the sealing member 7 disposed on the side surface of the light emitting element 5 and the member disposed between the light emitting element 5 and the base body 4. For example, a material having a high reflectivity can be used for the sealing member 7 disposed on the side surface of the light emitting element 5, and a material for strengthening adhesion between the light emitting element 5 and the base body 4 can be used for the member disposed between the light emitting element 5 and the base body 4.

Particularly, the sealing member 7 disposed between the light emitting element 5 and the base body 4 is preferably formed of a resin having a linear expansion coefficient within ±20% of the linear expansion coefficient of the external connection terminal 3. From another point of view, the sealing member 7 is formed of a resin having a linear expansion coefficient of preferably about 30 ppm/° C. or less, more preferably about 25 ppm/° C. or less. From still another point of view, the glass transition temperature is preferably 50° C. or lower, more preferably 0° C. or lower. The sealing member 7 and the base body 4 can be accordingly prevented from being peeled from each other.

An edge of the sealing member 7 in plan view (plan view as seen from the light extraction surface side) may be disposed on the inside or outside from an edge of the base body 4. In the case where the sealing member 7 has a shape that is narrow and long in the longitudinal direction, one edge of the sealing member 7 extending along the longitudinal direction preferably coincides with an edge of the base body 4 extending along the longitudinal direction. That is, it is preferred that at least one of end surfaces of the sealing member 7 extending along the longitudinal direction forms the same plane with one of end surfaces of the base body 4 extending along the longitudinal direction, and it is more preferred that both end surfaces of the sealing member 7 form the same plane with both end surfaces of the base body 4. Accordingly, the area of the light extraction surface can be increased, so that light extraction efficiency can be enhanced, without increasing the thickness of the light emitting device. An edge of the sealing member 7 extending along the short direction is usually disposed on the inside from an edge of the base body 4 extending along the short direction. The term a "same plane" in the present specification refers not only to the exact meaning, but also to a meaning that includes, in the case where the sealing member 7 having a slightly rounded shape, in which a part of the rounded shape coincides with the end surface of the base body 4.

The size of the sealing member 7 is preferably larger than the light emitting element 5 in terms of plane area as seen from the light extraction surface side. Particularly, the length of the outermost shape of the sealing member 7 in the longitudinal direction is preferably about 1.01 to 4.0 times the length of one side of the light emitting element 5. Specifically, a length of about 300 to 2000 μm is preferred, and a length of about 1000 to 1500 μm is more preferred. The thickness of the sealing member 7 (also referred to as a width from the end surface of the light emitting element 5 to the outermost shape of the sealing member 7 as seen from the light extraction surface side, or a minimum width of the sealing member 7 at the side surface of the light emitting element 5) is, for example, about 1 to 1000 μM, preferably about 50 to 500 μm or about 100 to 200 μm. Preferably, the sealing member 7 has such a height that in the case where the light emitting element 5 is mounted on the base body 4, the upper surface of the sealing member 7 forms the same plane with the upper surface of the light emitting element 5. The sealing member 7 can be formed by screen printing, potting, transfer molding, a compression molding or the like. In the case of using a molding machine, a mold release film may be employed.

For sealing (covering) the whole of the side surface of the light emitting element 5, a surface of the light emitting element 5 opposite to the base body 4, and so on, the sealing member 7 is usually formed after the light emitting element 5 is mounted on the base body 4, but the sealing member 7 may be provided so as to cover the upper surface or side surface of the light emitting element 5 before the light emitting element 5 is mounted on the base body 4.

(Light Transmissive Member 10)

Preferably, the upper surface of the light emitting element 5, i.e. the light extraction surface of the light emitting device is provided with a light transmissive member 10. Preferably, the light transmissive member 10 covers the upper surface of the sealing member 7 in the case where the side surface of the light emitting element 5 is covered with the light shielding sealing member 7, and the upper surface of the light emitting element 5 is not covered with the sealing member 7. The end surface of the light transmissive member 10 may be covered with or may be not covered with the sealing member 7.

The light transmissive member 10 is preferably one permeable to 60% or more, further preferably 70%, 80% or 90% or more of light emitted from the light emitting layer. The light transmissive member 10 may be a member similar to the sealing member 7, or may be a member different from the sealing member 7. Examples include resins such as silicone resins, silicone modified resins, silicone reformed resins, epoxy resins, epoxy modified resins, phenol resins, polycarbonate resins, acrylic resins, TPX resins, polynorbornene resins, and hybrid resins containing at least one of these resins, and glass. Among these, silicone resins or epoxy resins are preferred, and silicone resins having excellent light resistance and heat resistance are more preferred.

The light transmissive member 10 is preferably one containing a phosphor that is excited by light from the light emitting element 5. As the phosphor, one known in the art can be used. Examples include yttrium-aluminum-garnet (YAG)-based phosphors activated by cerium, lutetium-aluminum-garnet (LAG)-based phosphors activated by cerium, nitrogen-containing calcium aluminosilicate (CaO—$Al_2O_3$—$SiO_2$)-based phosphors activated by europium and/or chromium, silicate ((Sr, Ba)$_2$SiO$_4$)-based phosphors activated by europium, β-sialon phosphors, nitride-based phosphors such as CASN-based or SCASN-based phosphors, KSF-based phosphors ($K_2SiF_6$:Mn) and sulfide-based phosphors. Accordingly, there can be provided a light emitting device that emits mixed-color light (e.g. white light) of primary light and secondary light having a visible wavelength, and a light emitting device that is excited by primary light of ultraviolet light to emit secondary light having a visible wavelength. In the case where the light emitting device is used for a backlight of a liquid crystal display or the like, it is preferred to use a phosphor that is excited by blue light to emit red light (e.g. KSF-based phosphor) and a phosphor that emits green light (e.g. β-sialon phosphor). The color reproduction range of a display including a light emitting device can be accordingly broadened. In the case where the light emitting device is used for illumination or the like, an element that emits bluish-green light can be used in combination with a red phosphor.

For example, the phosphor is preferably one having a central particle size of 50 μm or less, 30 μm or less or 10 μm or less. The central particle size can be measured and calculated using a commercially available particle measurement device, particle size distribution measurement device, or the like. The above-mentioned particle size refers to a particle size obtained by an air permeability method in F.S.S.S.No (Fisher Sub Sieve Sizer's No). Particularly, in the case of using YAG or the like as a phosphor, the phosphor is preferably a bulk body (e.g. a plate-shaped body) obtained by uniformly dispersing and sintering ultrafine particles thereof. According to the above-mentioned form, high transparency can be secured by reducing voids and impurity layers as a single crystal structure and/or a polycrystalline structure.

The phosphor may be a luminescent material referred to as a so called nanocrystal or quantum dot. Examples of the material thereof include nano-size high-dispersive particles of semiconductor materials, for example group II-VI, group III-V and group IV-VI semiconductors, more specifically CdSe, core-shell type $CdS_xSe_{1-x}$/ZnS, and GaP. For example, such a phosphor has a particle size of about 1 to 20 nm (the number of atoms: about 10 to 50). By using such a phosphor, internal scattering can be suppressed, so that light transmittance can be further improved. By suppressing internal scattering, light components distributed in a direction perpendicular to the upper surface can be increased, and simultaneously light directed toward the side surface or the lower surface of the light emitting device can be suppressed, so that light extraction efficiency can be further improved. For example, in the case of applying the light emitting device to a backlight, efficiency of entrance of light to the backlight can be further enhanced. The quantum dot phosphor is unstable, and therefore may be surface-modified or stabilized with a resin such as PMMA (polymethyl methacrylate). This may be a bulk body (e.g. plate-shaped body) with the phosphor mixed with a transparent resin (e.g. an epoxy resin, a silicone resin or the like) and molded, or may be a plate-shaped body with the phosphor sealed between glass plates together with a transparent resin.

The light transmissive member 10 is preferably one composed of a member selected from a layered transparent polycrystalline phosphor plate in which a plurality of particle layers containing a particulate phosphor are laminated, and a transparent single crystal phosphor plate. Accordingly, in the light transmissive member 10, scattering can be further reduced, so that light extraction efficiency etc. can be further improved.

The phosphor is not necessarily contained in the above-mentioned member, but may be provided at various positions or various members in the light emitting device. For example, the phosphor may be provided as a phosphor layer applied or bonded onto a light transmissive member which does not contain a phosphor.

The light transmissive member 10 may contain a filler (e.g. a diffusing agent, a colorant or the like). Examples include silica, titanium oxide, zirconium oxide, magnesium oxide, glass, a crystal or sintered body of a phosphor, and a sintered body of a phosphor and an inorganic binding material. Optionally, the refractive index of the filler may be adjusted. The refractive index is, for example, 1.8 or more.

The shape of particles of the filler may be any of a granular shape, a spherical shape, a hollow shape and a porous shape. The average particle size (median size) of the particles is preferably about 0.08 to 10 μm at which a light scattering effect is obtained with high efficiency. The amount of the phosphor and/or the filler is, for example, preferably about 10 to 80% by weight based on the total weight of the light transmissive member 10.

Examples of the method for forming the light transmissive member 10 include a method in which a light transmissive member is molded in the form of a sheet, and bonded by a hot melt method or by an adhesive, a method in which a phosphor is deposited by an electrophoretic deposition method, and then impregnated with a light transmissive resin, potting, compression molding, a spraying method, an electrostatic coating method and a printing method. At this time, silica (Aerosil) or the like may be added for adjusting the viscosity or fluidity. Among these, a spraying method, particularly a pulse spraying method of injecting spray pulsewise, i.e. intermittently is preferred in the case where a phosphor is included in the light transmissive member. By injecting spray intermittently, the injection amount of the light transmissive member per unit time can be decreased. Thus, by moving a spray injection nozzle at a low speed while injecting spray in a small injection amount, a phosphor can be uniformly applied to a coating surface having an irregularity shape. In the pulse spraying method, the wind speed of air can be reduced without reducing the jetting speed of slurry from the nozzle as compared to a continuous spraying method. Thus, the slurry can be properly supplied to the coating surface, and the applied slurry is not disordered by an air stream. As a result, a coating film having high adhesion between phosphor particles and the surface of the light emitting element 5 can be formed. A plurality of laminated thin particle layers containing a particulate phosphor can be formed. By controlling the number of laminated layers in this way, thickness accuracy thereof can be improved. Deviation of the distribution of the phosphor can be suppressed, light subjected to uniform wavelength conversion can be emitted, and occurrence of color irregularity etc. of the light emitting element 5 can be avoided.

The pulse spraying method is a known method described in, for example, JP 61-161175 A, JP 2003-300000 A and WO 2013/038953, and the use material and conditions etc. thereof can be appropriately adjusted. For example, slurry to be applied contains a solvent, a thermosetting resin and a particulate phosphor. Examples of the thermosetting resin include silicone resins, epoxy resins and urea resins. As a solvent, an organic solvent such as n-hexane, n-heptane, toluene, acetone or isopropyl alcohol can be used. For example, the phosphor is used in an amount of preferably 10 to 80% by weight. The slurry is adjusted to have a viscosity of preferably about 0.01 to 1000 mPa·s, more preferably about 0.1 to 100 mPa·s.

The thickness of the light transmissive member 10 is not particularly limited, and is, for example, about 1 to 300 μm, preferably about 1 to 100 μm, more preferably about 2 to 60 μm or about 5 to 40 μm. Particularly, in the case where the light transmissive member 10 is stacked by the spraying method, the thickness of the light transmissive member 10 is preferably 20 times or less, more preferably 10 times or less, 6 times or less, 4 times or less or 3 times or less the total thickness of the stacked layer of the nitride semiconductor. With the light transmissive member 10 having the above-mentioned thickness, a light emitting device can be formed smaller and thinner while obtaining sufficiently wavelength conversion of light. From another point of view, the thickness of the light transmissive member 10 is preferably 2 times or less the thickness of the sealing member 7 at the side surface of the light emitting element 5, more preferably 2 times or less the minimum width, further preferably equal to or less than the minimum width. With the light transmissive member 10 having a relatively small thickness as described above, light emitted from the light emitting element 5 can be extracted only in one direction of the light extraction surface without being emitted from the end surface (side surface) of the light transmissive member 10, irrespective of whether or not the light transmissive member 10 is covered with the sealing member 7, as will be described below. Accordingly, light extraction efficiency can be improved.

Particularly, in backlight applications, a light transmissive member having a relatively small thickness as described above can further enhance luminous efficiency of the light emitting element 5 and luminous efficiency of the backlight device. For example, as described above, the ratio of side surface light to front surface light can be reduced, so that efficiency of entrance of light to a light guide plate of the backlight can be enhanced. Further, the resin amount can be decreased, and therefore the ratio of a transparent resin having a relatively low heat emissivity can be reduced, so that heat accumulation can be reduced. At the same time, the contact area between the light emitting element 5 and the phosphor or between phosphors can be increased, and a heat transfer path can be secured. Accordingly, heat releasability can be improved to improve luminous efficiency. Further, the distance between the surface of the light emitting element 5 and the entrance of light to the light guide plate can be minimized, and therefore light can be made to enter the light guide plate of the backlight device with a higher luminance, so that luminous efficiency in the backlight device can be enhanced.

The upper surface (light extraction surface) of the light transmissive member 10 may be a flat surface, or the upper surface (light extraction surface) and/or a surface in contact with the light emitting element may be an irregularity surface such as a convex surface or a concave surface to control distribution of light. In the case where a plurality of particle layers containing a particulate phosphor are laminated as described above, irregularities corresponding to the particle size of the phosphor are passed to the surface of the light transmissive member 10. Thus, by laminating a thin light transmissive member 10 containing a phosphor, the amount of resin can be reduced to obtain a moderate irregularity shape while aggregation of the phosphor is prevented and detachment of the phosphor is prevented. As a result, light extraction is effectively performed. That is, in considering discoloration or life and heat releasability of the light transmissive member 10, a resin-containing member such as the light transmissive member 10 is preferably as thin as possible as long as the adhesive strength etc. can be retained. On the other hand, there is the concern of detachment of the light transmissive member 10. However, these problems can be solved by reducing the amount of resin to obtain a moderate irregularity shape.

The light transmissive member 10 may be provided in the light emitting device by bonding the light transmissive member 10 to the upper surface of the light emitting element 5 before the light emitting element 5 is mounted on the base body 4. Particularly, in the case where the light emitting element 5 is formed of a semiconductor laminate freed of a growth substrate of a semiconductor layer, for example, the light emitting element 5 is bonded or fixed to a hard light transmissive member 10 of glass, ceramic or the like to enhance the strength of the light emitting element 5, so that handling characteristics, reliability of mounting of the light emitting element 5, and so on can be improved.

(Insulating Member)

Preferably, the light emitting device according to the embodiment of the present invention has an insulating member disposed so as to cover at least a part of the external connection terminal 3 on the base body 4. More preferably, the insulating member is in contact with the sealing member 7. Further, the insulating member is preferably disposed between the element connection section and the external connection section of the external connection terminal 3, and more preferably disposed so as to completely separate a surface region between the element connection section and the external connection section. Accordingly, a situation can be avoided in which solder penetrates along the surface of the external connection terminal 3 to deteriorate reliability of the light emitting device in the case where the light emitting device is mounted on the mounting substrate 51 as will be described below.

Preferably, the insulating member is disposed on the external connection terminal 3 such that the edge of the sealing member 7 is disposed on the insulating member. Accordingly, adhesion between the sealing member 7 and the base body 4 can be enhanced to reduce the possibility that the sealing member 7 is peeled. Particularly, in the case where the sealing member 7 has a shape that is long in the longitudinal direction as described above, it is more preferred that the insulating member 7 is disposed on the external connection terminal 3 such that the edge of the sealing member 7 in the longitudinal direction is disposed on the insulating member. Accordingly, the possibility that the sealing member 7 is peeled can be reduced even in the case where the base body 4 is warped or distorted. A pair of insulating members may be provided so as to cover each of a pair of external connection terminals 3, or the insulating member may continuously cover a pair of external connection terminals 3.

The insulating member may be formed of any material as long as it has insulation quality. For example, the material shown as an example for the above-described sealing member 7 and the later-described light transmissive member can be used. Among these, it is preferred to use a silicone resin which contains a white material and has high heat resistance.

The shape of the insulating member is not particularly limited, and is preferably a belt shape which continuously extends from the adjacent region of the element connection section to the outside of the sealing member 7, i.e. the external connection section. Specifically, the length of the insulating member in the longitudinal direction is about 1/10 to 1/5 times the length of the sealing member 7. The width of the insulating member is preferably equal to or smaller than the width of the base body 4 and/or the sealing member 7. With the insulating member having the above-mentioned width, the insulating member can form the same plane with one end surface of the base body 4 and/or the sealing member 7, and can form the same plane with both the opposite end surfaces of the base body 4 and the sealing member 7. Particularly, in the case where the external connection terminal 3 has a region which is reduced in width, it is preferred that the width-reduced region is completely covered. Accordingly, a situation can be avoided in which solder penetrates along the surface of the external connection terminal 3 to deteriorate reliability of the light emitting device in the case of mounting the light emitting device on the mounting substrate 51 as will be described below.

The insulating member can be formed by a method in which the above-described material is molded into a sheet and stuck, a printing method, an electrophoretic deposition method, potting, compression molding, spraying and an electrostatic coating method. The thickness of the insulating member is not particularly limited, and can be, for example, about 10 to 300 μm. It is preferred that the insulating member is continuously formed from below the sealing member 7 to the external connection section side in the case where the sealing member 7 is molded using a mold. Accordingly, the mold for molding the sealing member 7 and the external connection terminal 3 can be prevented from coming into contact with each other to damage the external connection terminal 3.

EXAMPLE

Hereinafter, an example of the light emitting device of the embodiment of the present invention will be described with reference to the drawings. A light emitting device 1 of this example includes a base body 4 including a base material 2 having a pair of external connection terminals 3 on a first main surface, a light emitting element 5, and a sealing member 7 as shown in FIGS. 1 and 2. The base body 4 has a configuration in which a pair of external connection terminals 3 formed by laminating Cu/Ni/Au (total thickness: 20 μm, linear expansion coefficient: about 20 ppm/° C.) from the base material 2 side are formed on a surface of the base material 2, i.e. an upper surface 2a as a first main surface, an end surface 2b extending in the short direction and a lower surface 2c as a second main surface. The base body 4 has a length of 1.8 mm in the longitudinal direction, a width of 0.3 mm in the short direction and a thickness of 0.45 mm, and functions as a wiring substrate. The strength of the base body 4 is 300 MPa or more as measured by a tensile strength tester.

The base material 2 is composed of a BT resin composition containing a naphthalene-based epoxy resin containing a commercially available glass cloth (HL832NSF type LCA manufactured by Mitsubishi Gas Chemical Company, Inc.). The base material 2 contains glass fibers, spherical silica, spherical silicone and carbon, and has a rectangular parallelepiped shape. The linear expansion coefficient of the base material 2 (without external connection terminals) is about 3 ppm/° C., and the glass transition temperature of a resin that forms the base material 2 is about 280° C.

A pair of external connection terminals 3 are close to each other at the central part of the base material 2 on the upper surface 2a side, and each have a projecting pattern 3a as an element connection section.

The projecting pattern 3a can be formed from a layer composed of copper (projecting thickness: 20 μm) by plating using a mask. The projecting patterns 3a are each situated at a position opposite to a corresponding one of a pair of electrodes formed on the light emitting element 5 to be described below, and have a size equivalent to that of the electrodes.

A pair of external connection terminals 3 are each continuously formed so as to extend in the longitudinal direction from the projecting pattern 3a as an element connection section and pass along the upper surface 2a and the end surface 2b to the lower surface 2c of the base material 2. In the external connection terminal 3, a region continuously extending from the projecting pattern 3a as an element connection section to the lower surface 2c of the base material 2 (U-shaped region in cross-sectional view) is an external connection section 3b (see FIG. 2). The edge of the external connection terminal 3 extending along the longitudinal direction coincides with the edge of the base body 4 extending along the longitudinal direction, and the end surface of the external connection terminal 3 extending along the longitudinal direction forms the same plane with the end surface of the base body 4 extending along the longitudinal direction.

Figure 17:
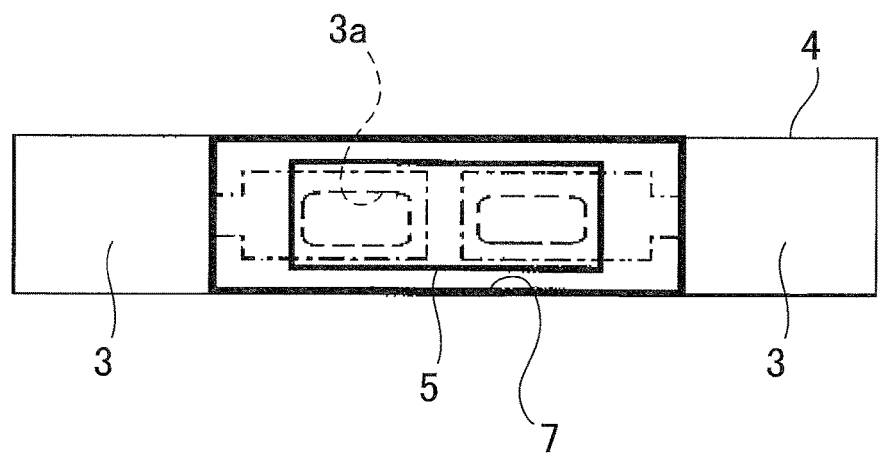
FIG. 17 is a perspective plan view of the light emitting device in FIG. 1.
Figure 18:
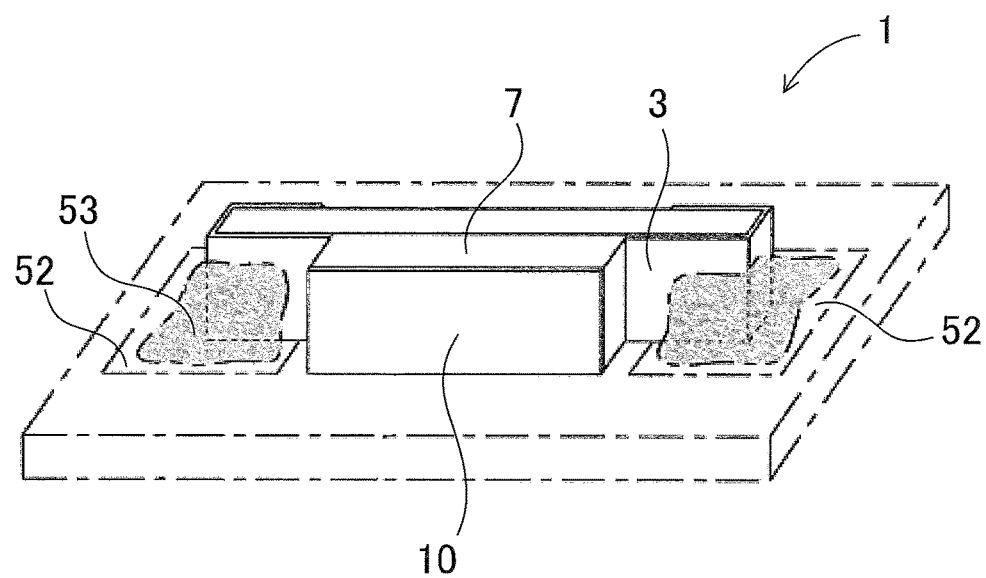
FIG. 18 is a schematic perspective view showing a state in which the light emitting device in FIG. 1 is mounted on a mounting member.

The external connection terminal 3 has a width-reduced region between the projecting pattern 3a and the external connection section 3b (see FIG. 17). Although not illustrated, the external connection terminal 3 has a region where a part of the external connection section 3b on the second main surface of the base body 4 is reduced in width.

One light emitting element 5 is flip-chip-mounted on the projecting pattern 3a of the external connection terminal 3. The light emitting element 5 has a nitride semiconductor laminate (thickness: about 8 to 12 μm) formed on a sapphire substrate (thickness: about 150 μm), and includes a pair of positive and negative electrodes on a surface opposite to the sapphire substrate of the laminate. In the light emitting element 5, each of the pair of positive and negative electrodes is connected to a corresponding one of the projecting patterns 3a of a pair of external connection terminals 3 of the base body 4 by meltable solder (thickness: 20 μm) that is Au—Sn eutectic solder. The surface of the sapphire substrate has irregularities (height: 0.5 μm, pitch: 10 μm), and therefore the corresponding surface of the nitride semiconductor laminate also has irregularities associated therewith. By using these projecting patterns 3a of the external connection terminals 3, penetration of the bonding member into an unintended region can be prevented by performing quantitative control of the meltable solder along with the shape and position of the projecting patterns 3a at the time of mounting of the light emitting element. As a result, the light emitting element is aligned to an intended region with high accuracy, so that the light emitting element can be fixed in the right place.

The light emitting element 5 is a rectangular parallelepiped-shaped LED chip which has a length of 0.9 mm in the longitudinal direction, a width of 0.2 mm in the short direction and a thickness of 0.15 mm and emits blue light (light emission peak wavelength: 455 nm). The surface roughness Ra of the side surface of the light emitting element 5 is 1.0 μm or less.

The sealing member 7 is molded in a substantially rectangular parallelepiped shape having a length (full length) of 1.2 mm in the longitudinal direction, a width (full length) of 0.3 mm in the short direction and a thickness of 0.15 mm. Edges of the sealing member 7 extending along the longitudinal direction coincide with edges of the base body 4 extending along the longitudinal direction. The sealing member 7 is provided on the first main surface of the base body 4 so as to be in contact with the light emitting element 5 such that the sealing member 7 covers the whole circumference of the side surface of the light emitting element 5 in contact therewith. The sealing member 7 is also provided on a surface of the light emitting element 5 opposite to the base body 4. That is, the sealing member 7 is disposed between the light emitting element 5 and meltable solder substantially completely covering the projecting patterns 3a, and substantially completely covers the surface of meltable solder. Further, the sealing member 7 may be provided between the light emitting element 5 and the base body 4. Accordingly, light can be efficiently extracted from the light emitting element 5 to the upper surface. Since the sealing member 7 is also provided on a surface of the light emitting element 5 opposite to the base body 4, the light emitting element 5 can be more strongly connected to the base body 4. The upper surface of the sealing member 7 substantially coincides with the upper surface of the light emitting element 5.

The sealing member 7 is formed of a silicone resin containing silica having an average particle size of 14 μm and titanium oxide having an average particle size of 0.25 to 0.3 μm as inorganic particles in amounts of 2 to 2.5% by weight and 40 to 50% by weight, respectively, based on the total weight of the sealing member 7. The silicone resin has a glass transition temperature of 40° C. and a linear expansion coefficient of about 50 ppm/° C. The edge of the sealing member 7 extending along the longitudinal direction coincides with the edge of the base body 4 extending along the longitudinal direction, and the end surface of the sealing member 7 extending along the longitudinal direction forms the same plane with the end surface of the base body 4 extending along the longitudinal direction.

The light transmissive member 10 (thickness: 20 μm) is disposed on the light emitting element 5, i.e. a surface on a side opposite to a pair of positive and negative electrodes. The light transmissive member 10 is formed by laminating three layers of silicone resin containing a phosphor of YAG:Ce having a central particle size of about 8 μm using a pulse spraying method. The light transmissive member 10 covers the upper surface of the sealing member 7. The end surface of the light transmissive member 10 coincides with the end surface of the sealing member 7.

In this light emitting device, a base body carrying a light emitting element has an extremely low linear expansion coefficient, and therefore a difference in linear expansion between the light emitting element and the base body due to heat applied during and after the production process can be kept extremely low. Accordingly, peeling between the light emitting element and the base body or application of undesired stress on the light emitting element, which results from a difference in linear expansion coefficient between the light emitting element and the base body, can be prevented, so that electrical connection can be secured. As a result, a light emitting device having a long life and excellent characteristics can be obtained.

As described above, the base material that forms a base body has a high glass transition temperature of 250° C. or higher, a resin having a small thermal expansion coefficient is used, and this resin contains an inorganic filler such as $SiO_2$, $Al_2O_3$ or a glass cloth, and optionally carbon black having heat releasability, a silicone filler that imparts an elastic modulus, and so on at a high ratio. Accordingly, heat generated by driving of the light emitting element can be efficiently released. Particularly, in the case of using the resin for a base material stained black with carbon black or the like, heat can be efficiently released by heat radiation because the emissivity of a far infrared ray etc. is high. In the case where the surface of the base body which is in contact with the sealing member is coated with a material having a high heat absorptivity, a material having a low absorptivity of an electromagnetic wave in a visible range, a material that absorbs an electromagnetic wave having a long wavelength, such as a far infrared ray, or a material having a high heat conductivity, heat releasability can be further enhanced. Accordingly, heat releasability of a small light emitting device can be improved, efficiency of wavelength conversion of light by a phosphor can be improved, and luminous efficiency of the light emitting element can be improved.

In the semiconductor light emitting device 1, each of a pair of end surfaces of the base body 18 extending along the longitudinal direction is disposed to form the same plane with a corresponding one of a pair of end surfaces of the sealing member 7 extending along the longitudinal direction as shown in FIG. 4. The semiconductor light emitting device 1 is mounted as a side view type on a mounting substrate 51 having a land pattern 52 on a surface thereof with one of the end surfaces which form the same planes as a mounting surface of the semiconductor light emitting device 1.

In mounting, a pair of external connection sections 3b of the semiconductor light emitting device 1 are placed on land patterns 52 corresponding to a positive electrode and a negative electrode of the mounting substrate 51, and connected thereto by solder 53. The solder 53 is connected such that the contact area with the small external connection terminal 3 is enlarged over not only the first main surface but also the end surface and the second main surface of the base body 4 at the external connection section 3b curved in a U shape. Accordingly, a fillet can be formed on the side surface of the light emitting device, so that heat releasability and mounting stability of the light emitting device can be improved.

Further, both the end surface of the sealing member 7 extending along the longitudinal direction and the end surface of the base body 4 extending along the longitudinal direction are in contact with a surface of the mounting substrate 51.

In the above example, a mounting structure for a semiconductor light emitting device such as LED and LD has been described, but the embodiment of the present invention is not limited to semiconductor light emitting devices, and can be applied to mounting of other semiconductor devices, for example light receiving elements, amplification elements and so on. Particularly, the embodiment of the present invention can be suitably used in applications where control of registering in posture is important in mounting of a small semiconductor device.

A mounting structure for a semiconductor light emitting device according to one aspect of the embodiment of the present invention is a mounting structure that includes a semiconductor device provided with an external connection terminal disposed at each of both ends in a longitudinal direction, and a mounting substrate for mounting the semiconductor device thereon. Each of the external connection terminals may have a metal region on a mounting surface for mounting the semiconductor device on the mounting substrate. The semiconductor device may include device-side mounting insulating regions which are defined by the respective metal regions. The mounting substrate may have on a mounting surface side thereof land patterns made of an electrically conductive material which are disposed on insulating regions to connect the respective external connection terminals. Each of the land patterns may be formed in a shape surrounding the respective end portion of the semiconductor device which is surrounded by the external connection terminal, and a land-side insulating region which has a shape corresponding to the periphery of the device-side mounting insulating region may be arranged in the land pattern.

A backlight device according to another aspect of the embodiment of the present invention is an edge light type backlight device which employs a light guide plate. The backlight device may include a light guide plate configured to introduce light from an end surface, a mounting substrate arranged at the end surface of the light guide plate, and a semiconductor light emitting device which is mounted on the mounting substrate with its light emitting surface facing the end surface of the light guide plate, and which is provided with an external connection terminal disposed at each of both ends in a longitudinal direction. Each of the external connection terminals may have a metal region on a mounting surface for mounting the semiconductor light emitting device on the mounting substrate. The semiconductor device may include device-side mounting insulating regions which are defined by the respective metal regions. The mounting substrate may have on a mounting surface side thereof land patterns made of an electrically conductive material which are disposed on insulating regions to connect the respective external connection terminals. Each of the land patterns may be formed in a shape surrounding the respective end portion of the semiconductor light emitting device, and a land-side insulating region which has a shape corresponding to the periphery of the device-side mounting insulating region may be arranged in the land pattern.

Further, a mounting substrate according to another aspect of the embodiment of the present invention is a mounting substrate for mounting a semiconductor device provided with an external connection terminal exposed from a base body. The mounting substrate may have on a mounting surface side thereof a land pattern of an electrically conductive material disposed on an insulating region to connect the external connection terminal. The land pattern may be formed in a shape surrounding an end portion of the semiconductor device, and a land-side insulating region which has a shape corresponding to the periphery of a device-side mounting insulating region which is an insulating region surrounded by the external connection terminal may be arranged in the land pattern.

According to the mounting structure for a semiconductor light emitting device, the backlight device and the amounting substrate in the embodiment of the present invention, a land-side insulating region extending along a device-side mounting insulating region is provided on a land pattern, and thus a positioning effect at the time of mounting can be exhibited to improve the yield in mounting.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor device mounting structure comprising:
    a semiconductor light emitting device having a first end and a second end opposite to the first end in a longitudinal direction of the semiconductor light emitting device, the semiconductor light emitting device comprising:
        a first external connection terminal provided at the first end and having a metal region on a bottom surface of the semiconductor light emitting device to be mounted on a mounting substrate; and
        a device-side mounting insulating region defined by the metal region on the bottom surface of the semiconductor light emitting device; and
    the mounting substrate which has a substrate top surface and on which the semiconductor light emitting device is mounted, the bottom surface facing the substrate top surface, the mounting substrate having on the substrate top surface a land pattern made of an electrically conductive material to be electrically connected to the first external connection terminal, the land pattern being provided in a first shape to surround the device-side mounting insulating region and including a land-side insulating region which has a second shape to correspond to a periphery of the device-side mounting insulating region, and wherein the metal region includes a linear region constituted by an edge of the first external connection terminal, the linear region surrounding the device-side mounting insulating region.

2. The semiconductor device mounting structure according to claim 1,
wherein the linear region is provided in a U-shape.

3. The semiconductor device mounting structure according to claim 1,
wherein the semiconductor light emitting device further comprises an insulating base body extended in one direction.

4. The semiconductor device mounting structure according to claim 3,
wherein the first external connection terminal has a rectangular planar metal region on a side surface of the base body which crosses the bottom surface of the semiconductor light emitting device.

5. The semiconductor device mounting structure according to claim 4,
wherein with the device-side mounting insulating region is disposed in a matching manner with respect to the land-side insulating region, the land pattern and the first external connection terminal are connected with each other by a bonding member disposed on the metal region so as to rise from a periphery of the metal region onto the rectangular planar metal region.

6. The semiconductor device mounting structure according to claim 1,
wherein the metal region has a shape having three sides that are connected in a U-shape, and
wherein a region surrounded by the three sides serves as the device-side mounting insulating region.

7. The semiconductor device mounting structure according to claim 1,
wherein the land pattern has a substantially rectangular shape as a whole, and
wherein a recessed land-side insulating region is provided in a recessed shape in a plan view at substantially a center of one side of the substantially rectangular shape.

8. The semiconductor device mounting structure according to claim 1,
wherein the land-side insulating region is arranged in each of opposite sides of a pair of substantially rectangular land patterns spaced apart from each other.

9. The semiconductor device mounting structure according to claim 1,
wherein an opening width of the land-side insulating region is smaller than a width of the device-side mounting insulating region.

10. The semiconductor device mounting structure according to claim 1,
wherein an opening width of the land-side insulating region is larger than a width of the device-side mounting insulating region.

11. The semiconductor device mounting structure according to claim 1,
wherein an opening width of the land-side insulating region is 0.2 mm or less.

12. The semiconductor device mounting structure according to claim 1,
wherein a height of the semiconductor light emitting device is 0.5 mm or less.

13. The semiconductor device mounting structure according to claim 1, wherein the semiconductor light emitting device is a light source for backlight.

14. The semiconductor device mounting structure according to claim 1, wherein the semiconductor light emitting device is configured to emit light from a light emitting surface, the device-side mounting insulating region disposed so as to overlap the linear region in a direction parallel to a direction of the emission of light from the light emitting surface.

15. A backlight device of edge light, comprising:
a semiconductor light emitting device having a first end, a second end opposite to the first end in a longitudinal direction of the semiconductor light emitting device, and a light emitting surface between the first end and the second end in the longitudinal direction, the semiconductor light emitting device comprising:
a first external connection terminal provided at the first end and having a metal region on a bottom surface of the semiconductor light emitting device to be mounted on a mounting substrate; and
a device-side mounting insulating region on the bottom surface of the semiconductor light emitting device;
a light guide plate having an end surface, the light emitting surface of the semiconductor light emitting device facing the end surface to input light into the light guide plate from the end surface; and
a mounting substrate which is disposed adjacent to the end surface, which has a substrate top surface, and on which the semiconductor light emitting device is mounted, the bottom surface of the semiconductor light emitting device facing the substrate top surface, the mounting substrate having on the substrate top surface a land pattern made of an electrically conductive material to be electrically connected to the first external connection terminal, the land pattern being provided in a first shape to surround the device-side mounting insulating region and including a land-side insulating region which has a second shape to correspond to a periphery of the device-side mounting insulating region, and
wherein the metal region includes a linear region constituted by an edge of the first external connection terminal, the linear region of the metal region surrounding the device-side mounting insulation region.

16. The backlight device according to claim 15, wherein the device-side mounting insulating region is disposed so as to overlap the linear region in a direction parallel to the input of light into the guide plate.

17. A mounting substrate and a semiconductor light emitting device, comprising:
a substrate top surface to face a bottom surface of the semiconductor light emitting device to be mounted on the mounting substrate, the semiconductor light emitting device having a first end and a second end opposite to the first end in a longitudinal direction of the semiconductor light emitting device, the semiconductor light emitting device comprising:
a first external connection terminal provided at the first end; and
a device-side mounting insulating region on the bottom surface of the semiconductor light emitting device; and
a land pattern provided on the substrate top surface and made of an electrically conductive material to be connected to the first external connection terminal of the semiconductor light emitting device, the land pattern being provided in a first shape having a size to surround the device-side mounting insulating region of the semiconductor device, the land pattern including a land-side insulating region that is an insulating region having a second shape to correspond to a periphery of the device-side mounting insulating region of the semiconductor light emitting device, and wherein the first external connection terminal includes a linear region constituted by an edge of the first external connection terminal, the linear region surrounding the device-side mounting insulating region.

18. The mounting substrate and the semiconductor light emitting device according to claim 17, wherein the semiconductor light emitting device is configured to emit light from a light emitting surface, the device-side mounting insulating region disposed so as to overlap the linear region in a direction parallel to a direction of the emission of light from the light emitting surface.

* * * * *